(12) United States Patent
Maeda et al.

(10) Patent No.: US 8,102,111 B2
(45) Date of Patent: Jan. 24, 2012

(54) ELECTROLUMINESCENCE DEVICE, METHOD OF MANUFACTURING ELECTROLUMINESCENCE DEVICE, AND ELECTRONIC APPARATUS

(75) Inventors: Tsuyoshi Maeda, Kai (JP); Tomotaka Matsumoto, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 830 days.

(21) Appl. No.: 11/456,313

(22) Filed: Jul. 10, 2006

(65) Prior Publication Data

US 2007/0015429 A1 Jan. 18, 2007

(30) Foreign Application Priority Data

Jul. 15, 2005 (JP) ................................ 2005-206552
Jul. 15, 2005 (JP) ................................ 2005-206708

(51) Int. Cl.
*H05B 33/24* (2006.01)
(52) U.S. Cl. ...................................................... 313/503
(58) Field of Classification Search ................... 313/503, 313/506; 445/24
See application file for complete search history.

(56) References Cited

U.S. PATENT DOCUMENTS

| 5,554,911 | A | 9/1996 | Nakayama et al. | |
|---|---|---|---|---|
| 5,804,918 | A | 9/1998 | Yazawa et al. | |
| 6,811,808 | B2 | 11/2004 | Ohshita et al. | |
| 7,166,959 | B2 * | 1/2007 | Suzuki et al. | 313/504 |
| 7,187,120 | B2 | 3/2007 | Ohshita et al. | |
| 7,321,197 | B2 | 1/2008 | Nakayama et al. | |
| 7,510,455 | B2 | 3/2009 | Suzuki | |
| 7,531,958 | B2 | 5/2009 | Nishikawa et al. | |
| 2003/0057828 | A1 * | 3/2003 | Roitman et al. | 313/506 |
| 2003/0185970 | A1 | 10/2003 | Ohshita et al. | |
| 2004/0217697 | A1 * | 11/2004 | Lee et al. | 313/504 |
| 2005/0040756 | A1 * | 2/2005 | Winters et al. | 313/504 |
| 2007/0102737 | A1 | 5/2007 | Kashiwabara et al. | |
| 2007/0200123 | A1 | 8/2007 | Yamamichi et al. | |
| 2008/0012008 | A1 * | 1/2008 | Song et al. | 257/40 |
| 2008/0297043 | A1 | 12/2008 | Nishikawa et al. | |

FOREIGN PATENT DOCUMENTS

| JP | A-09-134788 | 5/1997 |
|---|---|---|
| JP | B 2797883 | 7/1998 |
| JP | A-2001-237068 | 8/2001 |
| JP | A-2004-355975 | 12/2004 |
| JP | A-2005-071919 | 3/2005 |
| JP | 2005-116516 | 4/2005 |
| JP | A-2005-093401 | 4/2005 |
| JP | A-2005-129510 | 5/2005 |
| JP | A-2005-197010 | 7/2005 |
| WO | WO 2005/039248 A1 | 4/2005 |
| WO | WO 2005/086539 A1 | 9/2005 |

* cited by examiner

*Primary Examiner* — Joseph L Williams
*Assistant Examiner* — Andrew Coughlin
(74) *Attorney, Agent, or Firm* — Oliff & Berridge, PLC

(57) ABSTRACT

An electroluminescence device includes a first, second, and third light emitting elements above a substrate. The first light emitting element includes a first transparent anode, a second transparent conductive film, a third transparent conductive film, a cathode, and a first light emitting function layer including a first luminescent layer which emits a first light of a first color. The second light emitting element includes a second transparent anode, the third transparent conductive film, the cathode, and a second light emitting function layer including a second luminescent layer which emits a second light of a second color, which is different from the first color. The third light emitting element includes a third transparent anode, the cathode, and a third light emitting function layer including a third luminescent layer which emits a third light of a third color, which is different from the first and second colors.

6 Claims, 10 Drawing Sheets

ELECTROLUMINESCENCE DEVICE, METHOD OF MANUFACTURING ELECTROLUMINESCENCE DEVICE, AND ELECTRONIC APPARATUS

The invention contains subject matter related to Japanese Patent Application 2005-206552 filed on Jul. 15, 2005 and Japanese Patent Application 2005-206708 filed on Jul. 15, 2005, in the Japanese Patent Office, the entire contents of which being incorporated herein by reference.

BACKGROUND

1. Technical Field

The present invention relates to an electroluminescence device, a method of manufacturing the electroluminescence device and an electronic apparatus.

2. Related Art

As a display device used for an electronic apparatus such as a mobile phone, a personal computer or a personal digital assistant (PDA) or an exposure head in an image forming apparatus such as a digital copier or a printer, a light emitting device such as an organic electroluminescence device (hereinafter, abbreviated to organic EL device) is attracting much attention.

Such a light emitting device, in order to realize color display, a configuration for emitting light of each color from each pixel by changing the material of a light emitting layer for each pixel has been known.

As disclosed in Japanese Patent No. 2,797,883, a technology of forming an optical resonator between a lower reflection layer formed below a light emitting layer and an upper reflection layer formed above the light emitting layer, changing a film thickness of a pixel electrode formed of indium tin oxide (ITO) to change an optical length of the optical resonator for each pixel, and extracting light of each color from light emitted from a light emitting element is suggested. When a bottom emission type organic EL device for emitting light from a light emitting layer to a substrate is configured using the disclosed technology, the lower reflection layer is formed of a semitransparent reflective layer. When a top emission type organic EL device for emitting light from a light emitting layer to the opposite side of a substrate is configured, the lower reflection layer is formed of a metal film having high reflectivity, such as aluminum or silver.

However, in order to form anodes having different film thicknesses by an ITO film, the ITO film is formed, a resist mask is formed on the ITO film using photolithography, and etching is performed. To this end, in order to cause the thicknesses of the anodes to be different from one another in a red pixel, a green pixel and blue pixel, the above-described step must be repeated at least three times.

As a result, the lower reflection layer is etched by etchant or etching gas used for etching the ITO film and thus the reflection property of the lower reflection layer deteriorates or lack of the lower reflection layer is caused. The etching of the lower reflection layer is not limited to the termination of the etching in which the lower reflection layer is exposed from the ITO film, and may be caused just after the beginning of the etching when a minute hole is formed in the ITO film.

In order to change the thickness of the anode for each pixel, for example, a method of changing an etching time for each of the three steps is considered. When the etching time varies depending on the step, it is difficult to manage the process. In addition, a side edge may be generated by increasing the etching time.

Since the ITO film is formed by plural steps, the steps become complicated and thus productivity deteriorates.

SUMMARY

An advantage of the invention is to provide an electroluminescence device which can prevent a lower reflection layer of an optical resonator located below an anode from deteriorating when the film thickness of the anode is caused to be different for each of a plurality of pixels, a method of manufacturing the electroluminescence device, and an electronic apparatus.

Another advantage of the invention is to provide an electroluminescence device which can easily form an anode with high precision by a small number of steps to realize high display performance and low cost when the film thickness of the anode is caused to be different for each of a plurality of pixels, a method of manufacturing the electroluminescence device, and an electronic apparatus.

According to an aspect of the invention, there is provided a method of manufacturing an electroluminescence device, in which a plurality of pixel forming regions is formed on a substrate, a light emitting element, in which an anode having a light transmission property, a light emission function layer including at least a light emitting layer and a cathode are laminated, is provided in each of the plurality of pixel forming regions, the pixel forming regions include a pixel forming region of first color and a pixel forming region of second color different from the first color, and the anode includes a first anode formed in the pixel forming region of the first color with a first thickness g and a second anode formed in the pixel forming region of the second color with a second thickness b, including: forming a first transparent conductive film in the pixel forming region of the first color with a thickness g−b obtained by subtracting the second thickness b from the first thickness g; and forming a second transparent conductive film in the pixel forming region of the second color with the second thickness b.

According to the invention, for example, in an electroluminescence device for displaying two primary colors (for example, green and blue), it is possible to easily realize an anode having an optical film thickness (optical length or optical distance) which is optimal in optical resonance of each color.

Here, a case where an anode having a first thickness dr is formed in a red pixel forming region and an anode having a second thickness dg is formed in a green pixel forming region will be described. First, in a first step, an anode having a thickness of dr−dg is formed in the red pixel forming region. Next, in a second step, an anode having the second thickness dg is laminated in the red pixel forming region and, at the same time, the anode having the second thickness dg is formed in the green pixel region. Then, the anode having a thickness (dr−dg+dg)=dr is formed in the red pixel forming region and the anode having a thickness dg is formed in the green pixel forming region.

In this case, for example, the first thickness dr may be twice the second thickness dg and the thicknesses of the anodes formed in the respective steps may be identical to each other. Therefore, according to the invention, the etching times of the first step and the second step may be similar to each other. According to the invention, it is possible to suppress the number of photolithographic processes from increasing, to prevent a side edge from being generated due to long-time etching, and to facilitate process management. In the invention, the pixel represents a light emitting element and a light emitting part (light emitting region) in which the light emitting element is formed and a pixel group is a set of pixels which emits different color light or same color light.

According to another aspect of the invention, there is provided a method of manufacturing an electroluminescence device, in which a plurality of pixel forming regions is formed on a substrate, a light emitting element, in which an anode having a light transmission property, a light emission function layer including at least a light emitting layer and a cathode are laminated, is provided in each of the plurality of pixel forming regions, the pixel forming regions include a pixel forming region of first color (for example, red), a pixel forming region of second color (for example, green) different from the first color and a pixel forming region of third color (for example, blue) different from the first and second colors, and the anode includes a first anode formed in the pixel forming region of the first color with a first thickness, a second anode formed in the pixel forming region of the second color with a second thickness and a third anode formed in the pixel forming region of the third color with a third thickness, including: forming a first transparent conductive film in the pixel forming region of the first color with a thickness obtained by subtracting the second thickness from the first thickness; forming a second transparent conductive film in the pixel forming region of the second color with a thickness obtained by subtracting the third thickness from the second thickness; and forming a third transparent conductive film in the pixel forming region of the three color with the third thickness.

According to the invention, for example, in an electroluminescence device for displaying three primary colors (for example, red, green and blue), it is possible to easily realize an anode having an optical film thickness which is optimal in optical resonance of each color.

Here, a case where an anode having a first thickness dr is formed in a red pixel forming region, an anode having a second thickness dg is formed in a green pixel forming region and an anode having a third thickness db is formed in a blue pixel forming region will be described. First, in a first step, an anode having a thickness of dr−dg is formed in the red pixel forming region. Next, in a second step, an anode having a thickness dg−db is laminated in the red pixel forming region and the anode having the thickness dg−db is formed in the green pixel region. Next, in a third step, an anode having a thickness db is laminated in the red pixel forming region, the anode having the thickness db is laminated in the green pixel forming region, and the anode having the thickness db is formed in the blue pixel forming region.

Then, the anode having a thickness (dr−dg)+(dg−db)+db=dr is formed in the red pixel forming region. The anode having a thickness (dg−db)+db=dg is formed in the green pixel forming region. The anode having the thickness db is formed in the blue pixel forming region.

In this case, the thicknesses of the anodes formed in the respective steps may be identical to one another. Therefore, according to the invention, the etching times of the first step to the third step may be similar to one another. According to the invention, it is possible to suppress the number of photolithographic processes from increasing, to prevent a side edge from being generated due to longtime etching, and to facilitate process management.

In the method of manufacturing the electroluminescence device, it is preferable that the light emitting element is an electroluminescence element in which an optical resonator has a lower reflection layer formed between the anode and the substrate, the first color is red, the second color is green, the third color is blue, and the forming of the first to third transparent conductive films are performed using a photolithographic process.

According to the invention, in the method of manufacturing a top emission type electroluminescence device for emitting light to the opposite side of the substrate when viewed from the light emitting layer, it is possible to suppress the number of photolithographic processes from increasing, to prevent a side edge from being generated due to long-time etching, and to facilitate process management.

According to another aspect of the invention, there is provided an electroluminescence device, wherein, in each of a plurality of pixel forming regions formed on a substrate, a light emitting element, in which an anode having a light transmission property, a light emission unction layer including at least a light emitting layer and a cathode are laminated, is provided, the pixel forming regions include a pixel forming region of first color (for example, red), a pixel forming region of second color (for example, green) different from the first color and a pixel forming region of third color (for example, blue) different from the first and second colors, the anode includes a first anode formed in the pixel forming region of the first color with a first thickness, a second anode formed in the pixel forming region of the second color with a second thickness and a third anode formed in the pixel forming region of the third color with a third thickness, the first anode is formed by laminating a first transparent conductive film having a thickness obtained by subtracting the second thickness from the first thickness, a second transparent conductive film having a thickness obtained by subtracting the third thickness from the second thickness and a third transparent conductive film having the three thickness, the second anode is formed by laminating the second transparent conductive film and the third transparent conductive film, and the third anode is formed of the third transparent conductive film.

According to the invention, it is possible to provide an electroluminescence device having anodes having different thicknesses in a plurality of pixel forming regions as a product having low cost and high reliability. Here, the physicality of the interface between the anodes laminated in the respective steps is different from that of the other portion. Accordingly, since the anode formed by the plurality of steps and the anode formed by a single step have different configurations, the anode formed by the plurality of steps can be specified.

In the electroluminescence device of the invention, it is preferable that light emitted from the light emitting layer is output from the substrate to the light emitting layer. In other words, it is preferable that the light emitted from the light emitting layer is output to the opposite side of the substrate when viewed from the light emitting layer.

According to the invention, it is possible to provide a top emission type electroluminescence device as a product having low cost and high reliability.

In the electroluminescence device of the invention, it is preferable that the light emitting element has an optical resonator having a lower reflection layer formed between the anode and the substrate and an insulating protective layer which has the light transmission property and covers the lower reflection layer is formed between the anode and the lower reflection layer.

In a manufacturing method of the related art, when the plurality of pixels has the anodes having different thicknesses, respectively, a plurality of etching steps must be performed when forming the anodes.

In contrast, in the electroluminescence device of the invention, since the insulating protective layer which has the light transmission property and covers the lower reflection layer is formed between the anode and the lower reflection layer, although a plurality of etching steps is performed to form the anode after the lower reflection layer is formed, it is possible to prevent the lower reflection layer from deteriorating due to the etching.

In the electroluminescence device of the invention, it is preferable that the lower reflection layer is formed of any one selected from the group consisting of aluminum, aluminum alloy, silver and silver alloy.

The metal layer such as aluminum, aluminum alloy, silver and silver alloy is apt to deteriorate by etchant, etching gas, or peeling solution at the time of forming the anode. According to the invention, since the lower reflection layer is covered by the insulating protective layer, it is possible to prevent the lower reflection layer from deteriorating by the etchant. According to the invention, since the metal which mainly includes aluminum, silver or the like is used for the lower reflection layer to increase the reflectivity of the lower reflection layer, it is possible to provide an electroluminescence device having high light emitting efficiency.

In the electroluminescence device of the invention, it is preferable that the refractive index of the insulating protective layer is smaller than that of the anode.

When the insulating protective layer is formed between the lower reflection layer and the anode, the optical distance (thickness×refractive index) of the insulating protective layer is included in the optical distance of the optical resonator. Here, the optical distance required for the optical resonator is determined for each color corresponding to the pixel.

When the refractive index of the insulating protective layer is large, the anode must be thin. Accordingly, it is difficult to form the thin anode with high precision and thus the thickness precision of the anode deteriorates. In contrast, in the invention, since the refractive index of the insulating protective layer is small, the anode can thicken. Accordingly, it is possible to easily form the anode with high thickness precision. Form such a viewpoint, the insulating protective layer is formed of SiN, $SnO_2$ or acrylic resin.

In the electroluminescence device of the invention, it is preferable that the thicknesses of the first anode, the second anode and the third anode are set such that the optical distance of the optical resonator corresponds to any one of the wavelengths of red light, green light and blue light. In other words, it is preferable that the thickness of the anode is set such that the optical distance of the optical resonator of each pixel corresponds to the length of any one of red light, green light and blue light.

According to the invention, it is possible to provide an electroluminescence device for color display using primary colors such as red, green and blue as a product having low cost and high reliability.

According to another aspect of the invention, there is provided an electroluminescence device, wherein each of a plurality of pixels formed on a substrate has a light emission function layer interposed between a first electrode and a second electrode, the plurality of pixels includes at least a first pixel, a second pixel and a third pixel, the first electrode of the first pixel is formed by laminating a first conductive film having high etching selectivity and a second conductive film having low etching selectivity, the first electrode of the second pixel is formed of the first conductive film, and the first electrode of the third pixel is formed of the second conductive film.

Now, the etching selectivity will be described.

The plurality of conductive films of the invention nave different etching rates against reactive gas in dry etching or medicinal solution in wet etching, depending on the kind of the material or the structure of the material (crystal state or amorphous state).

For example, with respect to a predetermined medicinal solution or predetermined reactive gas, one of the plurality of conductive films is etched at a high rate (etching speed or etching rate), but the other conductive films is hardly etched.

In the present invention, the etching selectivity is a degree that the plurality of conductive film is easy to be etched, with respect to the predetermined medicinal solution or predetermined reactive gas. When the plurality of conductive films is etched using the same medicinal solution or reactive gas in the same step, a conductive film which is easy to be etched is determined to have high etching selectivity and a conductive film which is hardly etched is determined to have low etching selectivity.

In the related art, when a plurality of first electrodes having different film thicknesses is formed, a resist mask forming step and an etching step are performed by the number of times corresponding to the number of the first electrodes. To this end, in the etching step, in order to prevent the first electrode formed previously from being etched, the first electrode which must not be etched need be covered by a resist mask.

In contrast, in the invention, since the first electrode is formed using difference in the etching selectivity of the plurality of conductive films, the conductive film (second conductive film) having high etching selectivity can be etched, without coating the conductive film (first conductive film) having low etching selectivity with the resist mask.

Therefore, according to the invention, since the step of forming the resist mask can be removed, that is, the number of the steps is reduced and the number of the masks is reduced, it is possible to realize an electroluminescence device with low manufacturing cost.

Each of the first electrodes of the plurality of pixels in a pixel group is formed of any one of the conductive film having the high etching selectivity and the conductive film having the low etching selectivity. Since the conductive film having the high etching selectivity and the conductive film having the low etching selectivity are laminated, each of the plurality of first electrodes is configured by a single-layer structure of the conductive film or a lamination structure of the plurality of conductive films.

In the electroluminescence device of the invention, it is preferable that the first conductive film and the second conductive film are a transparent conductive film.

In the electroluminescence device of the invention, it is preferable that the film thickness of the first conductive film is different from that of the second conductive film. That is, it is preferable that the plurality of first electrodes has different film thicknesses.

Accordingly, since the plurality of first electrodes has different film thicknesses and is transparent, the first electrodes can function as the optical resonator and thus the optical length of the optical resonator can be changed (adjusted) for each pixel.

For example, in a pixel of red light having a relatively long wavelength (about 600 nm) of visible light, by increasing (adjusting) the film thickness of the first electrode, the optical length from the first electrode to the second electrode can be adjusted to the length according to the wavelength of the red light.

For example, in a pixel of blue light having a relatively short wavelength (about 400 nm to 490 nm) of the visible light, by decreasing (adjusting) the film thickness of the first electrode, the optical length from the first electrode to the second electrode can be adjusted to the length according to the wavelength of the blue light.

For example, in a pixel of green light having a middle wavelength (about 490 nm to 570 nm) between the wavelengths of red light and blue light, by adjusting the film thickness of the first electrode, the optical length from the first electrode to the second electrode can be adjusted to the length according to the wavelength of the green light.

In order to lengthen the optical length, a plurality of conductive films is laminated, and, in order to shorten the optical length, a single conductive film is formed, thereby adjusting the optical length. Even in the case of forming the single conductive film, the optical length may be adjusted by selecting a thick film or a thin film in consideration of the required optical length. The optical length may be adjusted by increasing or decreasing the film thicknesses of the plurality of the conductive films in consideration of the required optical length.

Since the optical length of the first electrode of each of the plurality of pixels is adjusted, it is possible to realize an organic electroluminescence device having high display performance. More specifically, improvement of a NTSC ratio, optimization of white balance, and achromatic image of white display can be realized and thus freedom of color design can be improved.

In the electroluminescence device of the invention, it is preferable that the first electrode in the first pixel is formed of the first conductive film and the second conductive film laminated on the first conductive film.

By this configuration, it is possible to obtain the above-described effect of the electroluminescence device.

In the electroluminescence device of the invention, it is preferable that a reflection film is formed between the substrate and the first electrode.

By this configuration, it is possible to reflect emitted color of the light emission function layer by the reflection film and to output the emitted light to the second electrode.

In the invention, the light emitted from the light emission function layer includes light (non-reflective light) output from the second electrode without being reflected and light (reflective light) output from the second electrode after being reflected from the reflection film. The optical length of the light reflected from the reflection film more lengthens by the passage of the conductive films of the first electrode, compared with the non-reflective light. To this end, the optical length need be adjusted by the balance between the reflective light and the non-reflective light. Even in this case, in the invention, since the optical length is adjusted by the single layer structure or the lamination structure of the conductive film, the optical length can be easily adjusted even when the reflective light and the non-reflective light are mixed.

In the electroluminescence device of the invention, it is preferable that a color emitted from the first pixel, a color emitted from the second pixel and a color emitted from the third pixel are different from one another. In other words, it is preferable that the plurality of pixels output different colors, respectively. It is preferable that the colors of the lights emitted from the plurality of pixels are red (R), green (G) and blue (B). The invention is not limited thereto and at least one of complementary colors such as cyan (C), magenta (M) and yellow (Y) may be included.

By this configuration, it is possible to perform full color display for each pixel group and thus to display a full-color image when a plurality of pixel groups is included (for example, arranged in an array).

In the electroluminescence device of the invention, it is preferable that the wavelength of light emitted from the light emission function layer in the first pixel, the wavelength of light emitted from the light emission function layer in the second pixel and the wavelength of light emitted from the light emission function layer in the third pixel are different from one another. In other words, in the plurality of pixels, it is preferable that the light emission function layers output the lights having different chromatic wavelengths.

By this configuration, since the light emission function layers generate different light colors, it is possible to output different colors for each pixel, that is, it is possible to obtain the above-described effect of the electroluminescence device.

In the electroluminescence device of the invention, it is preferable that each of the plurality of pixels includes a color layer which faces the light emission function layer and the color of the color layer in the first pixel, the color of the color layer in the second pixel and the color of the color layer in the third pixel are different from one another. In other words, it is preferable that, in each of the plurality of pixels, a plurality of color layers which face the light emission function layers, respectively, is included.

The color layers are, for example, color layers of RGB, respectively.

When the light emitted from the light emission function layers of the plurality of pixels is a single white light, the white lights output from the light emission function layers transmit the color layers and thus the color layers color the white lights to RGB (transmit RGB for each chromatic wavelength), it is possible to output different colors for each pixel. It is possible to obtain the above-described effect of the electroluminescence device.

When the colors of the lights emitted from the light emission function layers of the plurality of pixels are, for example, colors of RGB, the lights of RGB emitted from the light emission function layers transmit the respective color colors and thus the color purity of the light emitted from the color layers can increase. It is possible to obtain the above-described effect of the electroluminescence device.

According to another aspect of the invention, there is provided a method of manufacturing an electroluminescence device, wherein each of a plurality of pixels formed on a substrate has a light emission function layer interposed between a first electrode and a second electrode, the plurality of pixels includes at least a first pixel, a second pixel and a third pixel, and a process of forming the first electrode includes forming a first conductive film in the first pixel and the second pixel and forming a second conductive film having etching selectivity lower than that of the first conductive film in the first and third pixels.

According to the invention, since the first electrode is formed using difference in the etching selectivity of the plurality of conductive films, the conductive film (second conductive film) having high etching selectivity can be etched, without coating the conductive film (first conductive film) having low etching selectivity with the resist mask.

Therefore, according to the invention, since the step of forming the resist mask can be removed, that is, the number of the steps is reduced and the number of the masks is reduced, it is possible to realize an electroluminescence device with low manufacturing cost.

Since at least one of the first electrodes is formed of any one of the conductive film having the high etching selectivity and the conductive film having the low etching selectivity, by the step of forming the plurality of first electrodes, and the conductive film having the high etching selectivity and the conductive film having the low etching selectivity are laminated to configure at least one of the first electrodes, each of the plurality of first electrodes is configured by a single-layer structure of the conductive film or a lamination structure of the plurality of conductive films.

In the invention, it is preferable that the first conductive film and the second conductive film are a transparent conductive film and the film thicknesses of the first electrodes are different from one another.

Accordingly, since the plurality of first electrodes formed by the first electrode forming step has different film thicknesses and is transparent, the first electrodes can function as the optical resonator and thus the optical length of the optical resonator can be changed (adjusted) for each pixel.

For example, in a pixel of red light having a relatively long wavelength (about 600 nm) of visible light, by increasing (adjusting) the film thickness of the first electrode, the optical length from the first electrode to the second electrode can be adjusted to the length according to the wavelength of the red light.

For example, in a pixel of blue light having a relatively short wavelength (about 400 nm to 490 nm) of the visible light, by decreasing (adjusting) the film thickness of the first electrode, the optical length from the first electrode to the second electrode can be adjusted to the length according to the wavelength of the blue light.

For example, in a pixel of green light having a middle wavelength (about 490 nm to 570 nm) between the wavelengths of red light and blue light, by adjusting the film thickness of the first electrode, the optical length from the first electrode to the second electrode can be adjusted to the length according to the wavelength of the green light.

In order to lengthen the optical length, a plurality of conductive films is laminated, and, in order to shorten the optical length, a single conductive film is formed, thereby adjusting the optical length. Even in the case of forming the single conductive film, the optical length may be adjusted by selecting a thick film or a thin film in consideration of the required optical length. The optical length may be adjusted by increasing or decreasing the film thicknesses of the plurality of the conductive films in consideration of the required optical length.

Since the optical length of the first electrode of each of the plurality of pixels is adjusted, it is possible to realize an organic electroluminescence device having high display performance. More specifically, improvement of a NTSC ratio, optimization of white balance, and achromatic image of white display can be realized and thus freedom of color design can be improved.

In the method of manufacturing the electroluminescence device of the invention, it is preferable that the process of forming the first electrode includes patterning the first conductive film after forming the first conductive film on the substrate and forming the second conductive film on the first conductive film patterned by the patterning of the first conductive film and the substrate and patterning the second conductive film.

By this configuration, it is possible to obtain the above-described effect.

According to another aspect of the invention, there is provided an electronic apparatus including the above-described electroluminescence device.

According to the invention, it is possible to provide an electronic apparatus capable of displaying a multi-color image with high quality as a product having low cost and high reliability.

As the electronic apparatus, for example, a mobile phone, a mobile information terminal, a watch, a word processor, an information processing apparatus such as a persona computer, and a printer may be exemplified. In addition, a television having large-sized display screen or a large-sized monitor may be exemplified. By employing an electro-optical device of the invention to a display part of the electronic apparatus, it is possible to provide an electronic apparatus having a display part having high display performance with low cost. In addition, the invention is applicable to a light source such as a printer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings.

In addition, the embodiments show some aspects of the invention, do not limit the invention, and may be changed in the technical range of the invention. In each view used for following description, the scale of each layer or each element is different from each other in order that each layer or each element has a size capable of being identified in the view.

First Embodiment

Basic Configuration of EL Device

Figure 1:
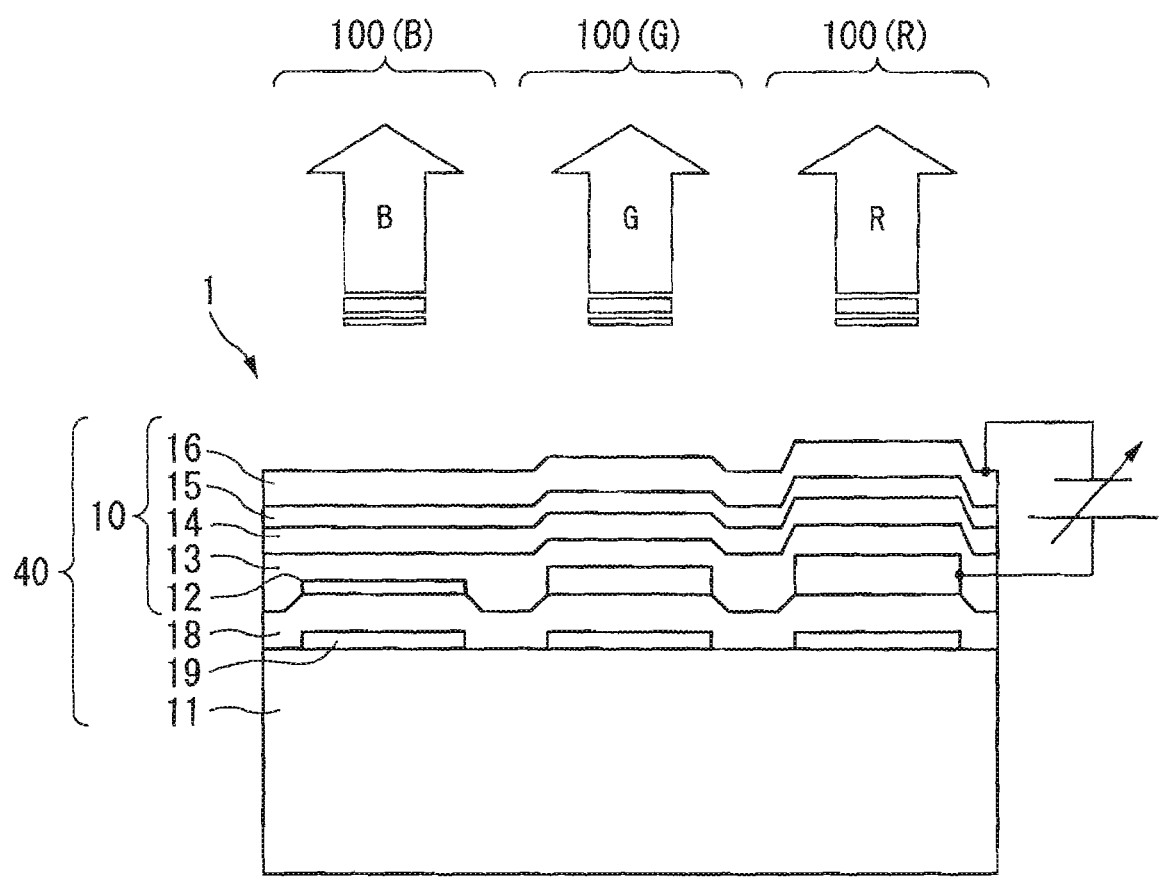
FIG. 1 is a cross-sectional view showing a configuration of an organic EL device according to a first embodiment of the invention.

FIG. 1 is a cross-sectional view schematically showing a configuration of an organic EL device (EL device) according to a first embodiment of the invention.

In FIG. 1, an organic EL device 1 according to the present embodiment is a too emission type device for emitting display light toward the opposite side of a substrate 11 when viewed from a light emitting layer 14. The organic EL device 1 has pixels 100(R), 100(G) and 100(B). The pixel 100(R) emits red (R) light, the pixel 100(G) emits green (G) light, and the pixel 100(B) emits blue (B) light. In the pixels 100(R), 100(G) and 100(B), an organic EL element 10 is formed.

The organic EL element 10 has a transparent anode 12 formed of indium tin oxide (ITO), a hole transport layer 13, a light emitting layer 14, an electron transport layer 15, and a cathode layer 16 formed of magnesium-silver alloy and having semitransparent reflectivity, all of which are laminated on the substrate 11 formed of glass in that order.

In each of the pixels 100(R), 100(G) and 100(B), the organic EL element 10 including the anode 12, the hole transport layer 13, the light emitting layer 14, the electron transport layer 15 and the cathode layer 16 is formed, and a reflection layer 19 and an insulating protective layer 18 (described below) are formed. A unit pixel is configured by the organic EL element 10, the reflection layer 19 and the insulating protective layer 18.

The anode 12 formed in the pixel 100(R) corresponds to a first anode, the anode 12 formed in the pixel 100(G) corresponds to a second anode, and the anode 12 formed in the pixel 100(B) corresponds to a third anode.

The reflection layer 19 (total reflection layer) formed of aluminum, aluminum alloy, silver or silver alloy is formed between the substrate 11 and the anode 12.

An optical resonator 40 is configured between a lower reflection layer formed of the reflection layer 19 and an upper reflection layer formed of the cathode layer 16.

The hole transport layer 13 and the light emitting layer 14 used for the organic EL element 10 are formed of the same material in all of the pixels 100(R) 100(G) and 100(B). The organic EL element 10 generates white light therein.

In the present embodiment, the thickness of the anode 12 is changed for each of the pixels 100(R), 100(G) and 100(B) and the thickness of the anode 12 increases in the order of the pixel 100(B), the pixel 100(G) and the pixel (R). For example, the thickness of the anode 12 is set such that, in the pixels 100(R), 100(G) and 100(B), the thickness of the anode 12 in the pixel 100(B)=30 nm,
the thickness of the anode 12 in the pixel 100(G)=65 nm, and
the thickness of the anode 12 in the pixel 100(R)=95 nm.

Accordingly, the optical length (optical distance) of the optical resonator 40 is changed in the pixels 100(R), 100(G) and 100(B). In other words, the thickness of the anode 12 is adjusted such that the optical lengths of the optical resonator correspond to predetermined color lights emitted from the pixels 100(R), 100(G) and 100(B), respectively. For example, the refractive index of the ITO for forming the anode 12 is 1.95.

In such a organic EL element 10, when current flows from the anode 12 to the cathode layer 16 through the hole transport layer 13 and the light emitting layer 14, the light emitting layer 14 emits light according to the current amount. The light emitted from the light emitting layer 14 transmits the cathode layer 16 to be emitted to a viewer side, and the light emitted from the light emitting layer 14 to the substrate 11 is reflected from the reflection layer 19 formed below the anode 12 and transmits the cathode layer 16 to be emitted to the viewer side. At this time, the light emitted from the light emitting layer 14 is multiple-reflected between the lower reflection layer (reflection layer 19) and the upper reflection layer (cathode layer 16) of the optical resonator 40 to improve light chromaticity in which the optical length of the optical resonator 40 corresponds to an integral multiple of ¼ wavelength. Accordingly, while the organic EL element 10 generate the white light therein, the pixel 100(R) corresponding to red (R) emits the red light, the pixel 100(G) corresponding to green (G) emits the green light, and the pixel 100(B) corresponding to the blue (B) emits the blue light.

Configuration of Insulating Protective Layer

In the present embodiment, the insulating protective layer 18 having a light transmission property is formed between the reflection layer 19 and the anode 12 to cover the front surface and the side surface of the reflection layer 19. The insulating protective layer 18 may be, for example, formed of silicon nitride (SiN) having a thickness of about 50 nm and a refractive index of 1.8.

Manufacturing Method

In order to manufacture the organic EL device 1 having the above-described configuration, first, a metal film (aluminum, aluminum alloy, silver, or silver alloy) having light reflectivity is formed on the surface of the substrate 11 by a sputtering method or a vacuum deposition method and is patterned using photolithography to form the reflection layer 19.

Next, the insulating protective layer 18 made of silicon nitride is formed on the surface of the reflection layer 19 by a CVD method.

Next, the ITO film having a predetermined thickness is formed on the surface of the insulating protective layer 18 by the sputtering method, a resist mask is formed on the ITO film using the photolithography, and etching is performed. In the present embodiment, since the thickness of the anode 12 is changed in the pixels 100(R), 100(G) and 100(B), this step is repeated three times. Accordingly, the anode 12 is formed. A method of forming the anode 12 is one of the characteristics of the invention and will be described in detail later.

Next, the hole transport layer 13 and the light emitting layer 14 are sequentially formed using a droplet discharging method which is also referred to as inkjet method). In the droplet discharging method, a liquid material for forming the hole transport layer 13 or the light emitting layer 14 is discharged as a droplet, is dried, and fixed as the hole transport layer 13 or the light emitting layer 14. At this time, it is preferable that a partitioning wall (not shown) which is called a bank is formed at the periphery of the pixels 100(R), 100(G) and 100(B) such that the discharged droplet or liquid material does not overflow.

When such a method is employed, as the hole injection material of the hole transport layer 13, for example, 3,4-polyethylenedioxythiophene-polystyrenesulfonate (PEDOT/PSS) which is polyolefin derivative is preferably used. Dispersion liquid in which an organic solvent of the hole injection material is dispersed as a main solvent is discharged to a predetermined region and dried to form the hole transport layer 13. The material of the hole transport layer 13 is not limited to the above and polyphenylene vinylene in which polymer precursor is polytetrahydrothiopheneth-iophenylphenylene, 1,1-bis-(4-N,N-ditolylaminophenyl)cyclohexane may be used.

As the material for forming the light emitting layer 14, a high molecular material such as a high molecular material having a molecular weight of at least 1000 is preferably used. More specifically, polyflorene derivative, polyphenylene derivative, polyvinylcarbazole derivative, polythiophene derivative, or a material in which perylene-based pigment, coumalin-based pigment, rhodamine-based pigment, rubrene, perylene, 9,10-diphenylanthracene, tetraphenylbutadiene, nile red, coumalin 6, quinacridone is doped to the high molecular material is used. As the high molecular material, a π-conjugated system high molecular material in which π electron of double bond is concentrated at the apex of the polymer is adequately used. The π-conjugated system high molecular material is high molecular material having conductivity and has light emitting performance. Particularly, a compound having fluorene skeleton in its molecule, that is, a polyfluorene-based compound is more adequately used. In addition to this material, a composition for the organic EL device disclosed in JP-A-11-40358, that is, the composition for the organic EL device including a precursor of a conjugated system high molecular organic compound and at least one kind of fluorescent pigment for changing the light emitting characteristics may be used as the material for forming the light emitting layer.

The hole transport layer 13 and the light emitting layer 14 are formed and the electron transport layer 15 and the cathode layer 16 are then sequentially formed.

Method of Forming Anode

Next, a method of forming the anode 12 will be described in detail.

Figure 2:
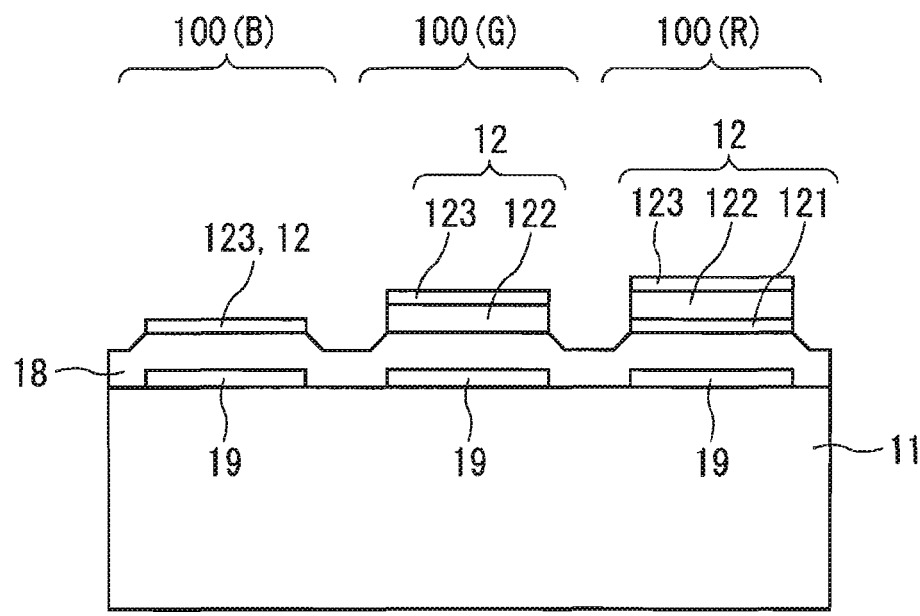
FIG. 2 is a cross-sectional view showing a method of forming an anode in the organic EL device.

FIG. 2 is a cross-sectional view showing a method of forming the anode 12 in the organic EL device 1 shown in FIG. 1. FIG. 3 is a schematic cross-sectional view showing the method of forming the anode 12 in detail.

First, as described in the above-described manufacturing method, the reflection layer 19 is formed on the surface of the substrate 11. Next, the insulating protective layer 18 is formed to cover the whole reflection layer 19. Thereafter, the anodes 12 having different thicknesses for each pixel are formed on the insulating protective layer 18, as shown in FIGS. 2, 3A, 3B and 3C.

Figure 3A:
FIGS. 3A to 3C are schematic cross-sectional views showing the method of forming the anode in detail.
Figure 3B:
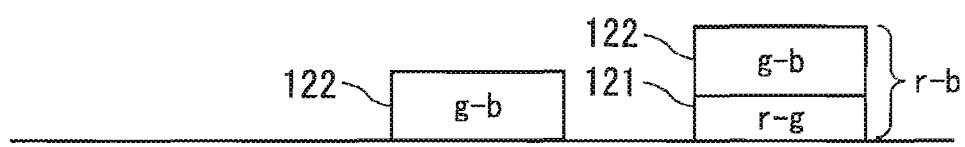
Figure 3C:
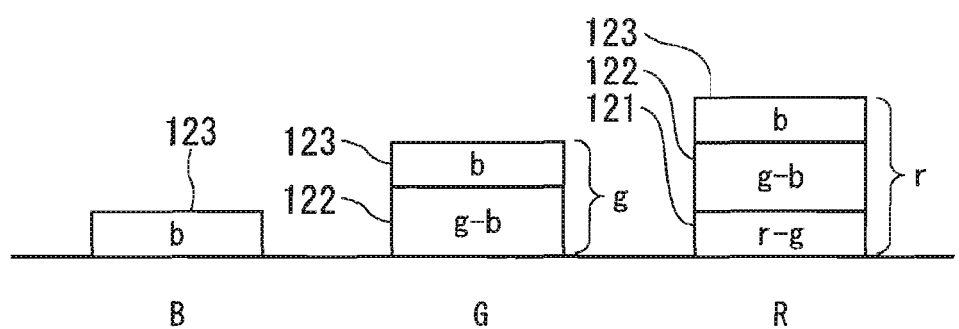

These anodes 12 are formed by performing the three photolithographic steps shown in FIGS. 3A, 3B and 3C. As shown in FIG. 2, in the pixel 100(R) of red (R), the anode 12 has a three-layer structure including an ITO film 121 (first transparent conductive film), an ITO film 122 (second transparent conductive film) and an ITO film 123 (third transparent conductive film). In the pixel 100(G) of red (G), the anode 12 has a two-layer structure including the ITO film 122 and the ITO film 123. In the pixel 100(B) of blue (B), the anode 12 has a single-layer structure including the ITO film 123.

For example, the film thickness of the anode 12 of the pixel 100(R) is 95 nm, the film thickness of the anode 12 of the pixel 100(G) is 65 nm, and the film thickness of the anode 12 of the pixel 100(B) is 30 nm.

In a first photolithographic step (first step) shown in FIG. 3A, the ITO film 121 having the film thickness (dr−dg=about 30 nm is formed on a region R for forming the pixel 100(R).

Next, in a second photolithographic step (second step) shown in FIG. 3B, the ITO film 122 having the film thickness (dg−db=about 35 nm) is formed on the region R for forming the pixel 100(R) and a region G for forming the pixel 100(G).

Next, in a third photolithographic step (third step) shown in FIG. 3C, the ITO film 123 having the film thickness (db=about 30 nm) is formed on the region R for forming the pixel 100(R), the region G for forming the pixel 100(G) and a region B for forming the pixel 100(B).

To this end, in the region R for forming the pixel 100(R), the anode 12 having the film thickness dr (95 nm) is formed by (r−g)+(g−b)+b=r. In the region G for forming the pixel 100 (G), the anode 12 having the film thickness dg (65 nm) is formed by (g−b)+b=g. In the region B for forming the pixel 100(B), the anode 12 having the film thickness db (30 nm) is formed. Accordingly, according to the present embodiment, it is possible to easily form the anodes 12 having the film thicknesses which are optimal in the optical resonance corresponding to the respective emission colors of the pixels.

Next, the concrete processing example of the three photolithographic steps will be described. First, a SiN layer is formed on the insulating protective layer 18 by 50 nm. Thereafter, the first step is performed.

First Step

The ITO film having the film thickness of 30 nm is formed on the SiN layer by the sputtering method. Next, resist is coated, pre-cured, exposed using a mask and developed, thereby forming the resist only on the region R for forming the pixel 100(R). Next, the ITO film 121 having the film thickness of 30 nm is formed only on the region R for forming the pixel 100(R) by curing the resist, etching the ITO film and peeling the resist (FIG. 3A).

Second Step

The ITO film having the film thickness of 35 nm is formed by the sputtering method. Next, resist is coated, pre-cured, exposed using a mask and developed, thereby forming the resist only on the region R for forming the pixel 100(R) and the region G for forming the pixel 100(G).

Next, the ITO film 122 having the film thickness of 35 nm is formed only on the region R for forming the pixel 100(R) and the region G for forming the pixel 100(G) by curing the resist, etching the ITO film and peeling the resist (FIG. 3B). That is, the ITO film having the film thickness of 65 nm (=30 nm+35 nm) is formed in the pixel forming region R and the ITO film having the film thickness of 35 nm is formed in the pixel forming region G.

Third Step

The ITO film having the film thickness of 30 nm is formed by the sputtering method. Next, resist is coated, pre-cured, exposed using a mask and developed, thereby forming the resist on the region R for forming the pixel 100(R), the region G for forming the pixel 100(G) and the region B for forming the pixel 100(B). Next, the ITO film 123 having the film thickness of 30 nm is formed on the region R for forming the pixel 100(R), the region G for forming the pixel 100(G) and the region B for forming the pixel 100(B) by curing the resist, etching the ITO film and peeling the resist (FIG. 3C). That is, the ITO film having the film thickness of 95 ran (=30 nm+35 nm+30 nm) is formed in the pixel forming region R, the ITO film having the film thickness of 65 nm (=35 nm+30 nm) is formed in the pixel forming region G, and the ITO film having the film thickness of 30 nm is formed in the pixel forming region B. Thus, the formation of the anodes 12 is finished.

According to the present embodiment, it is possible to easily realize the optical film thickness, which is optimal in the optical resonance for each of the pixels of red, green and blue, by three photolithographic steps. The ITO electrodes (anodes 12) having different film thicknesses for each color pixel cannot be formed by the three photolithographic steps without using the manufacturing method and the lamination structure of the ITO film of the present embodiment. In the present embodiment, since the thickest anode 12 of the red pixel forming region R is formed by the three steps, the respective etching times of the steps (first to third steps) are similar to one another and thus the process management can be facilitated. When the anode 12 having the large film thickness is formed by one step, the etching time increases and thus a side edge is apt to be generated. According to the present embodiment, an etching depth can be equally divided in the first step and the second step and thus the side edge can be prevented from being generated.

Although, in the present embodiment, the plurality of pixels 100 correspond to red (R), green (G) and blue (B) the material of the organic function layers such as the hole transport layer 13 or the light emitting layer 14 for configuring the organic EL element 10 is identical, regardless of the color, and it is determined which color corresponds to a pixel, according to the thickness of the anode 12 that is, in the present embodiment, the optical resonator 40 is configured in each pixel 100 and the optical length of the optical resonator 40 is set to the length corresponding to any one of red light, green light and blue light by the thickness of the anode 12. Accordingly, since the lifetimes of the organic EL elements 10 are substantially equal to one another regardless of which color corresponds to the pixel 100, it is possible to increase the lifetime of the organic EL device 1. Since the same material is used in the pixels 100 when manufacturing the organic EL device 1, it is possible to improve productivity.

Since the pixels in which the anodes 12 have different thicknesses are included in the plurality of pixels 100, several etching steps are performed when forming the anodes 12.

However, in the present embodiment, since the insulating protective layer 18 which has a light transmission property and covers the reflecting layer 19 is formed between the anode 12 and the reflection layer 19, although several etching steps are performed so as to form the anodes 12 after forming the reflection layer 19, the reflection layer 19 does not deteriorate by the etching steps. In the present embodiment, the light generated at the light emitting layer 14 is emitted to the opposite side of the substrate 11 when viewed from the light emitting layer 14. In this case, the reflection layer 19 requires high reflectivity. According to the present embodiment, since the reflection layer 19 does not deteriorate by the etching step performed when the anodes 12 are formed, it is possible to configure the reflection layer 19 having high reflectivity. Therefore, according to the present embodiment, it is possible to provide an organic EL device having high light emitting efficiency.

In order to increase the reflectivity of the reflection layer 19, the reflection layer 19 is preferably formed of aluminum, aluminum alloy, silver or silver alloy. Such a metal layer is apt to deteriorate by the etchant or etching gas used for etching the ITO film. However, according to the present embodiment, since the reflection layer 19 does not deteriorate by the etching step performed when the anodes 12 are formed, the reflection layer 19 can be formed of aluminum, aluminum alloy, silver or silver alloy.

In the present embodiment, since the insulating protective layer 18 is interposed between the reflection layer 19 and the anode 12, the optical length (thickness×refractive index) of the insulating protective layer 18 is included in the optical length of the optical resonator 40. In this case, when the refractive index of the insulating protective layer 18 is large, since the optical length required for the optical resonator 40 is determined for each color of the pixel, the anode 12 must be thin and thus the thickness precision of the anode 12 deteriorates.

However, in the present embodiment, since the insulating protective layer 18 is formed of silicon nitride (SiN) and the refractive index thereof is 1.8, it is possible to thicken the anode 12. When the anode 12 is thick, the thickness precision is improved.

It is preferable that the refractive index of the insulating protective layer 18 is smaller than the refractive index (=1.95) of the anode 12 and the material of the insulating protective layer 18 is SiON (refractive index: 1.7), $SiO_2$ or acrylic resin (for example, refractive index: 1.6).

Accordingly, according to the present embodiment, it is possible to manufacture an organic EL device including an optical resonator having high efficiency without deteriorating the reflection layer 19 when the anodes 12 having different film thickness for each pixel are formed.

Although, in the present embodiment, the organic EL device for color display using three primary colors is described, the invention is applicable to an organic EL device for color display using two primary colors. For example, the organic EL device has the green pixel 100(G) and the blue pixel 100(B). Using the steps shown. In FIGS. 3B and 3C, the anode 12 including the ITO film 122 and the ITO film 123 are formed in the pixel forming region G of the pixel 100(G) and the anode 12 including the ITO film 123 is formed in the pixel forming region B of the pixel 100(B). To this end, in the method of manufacturing the organic EL device for color display using the two primary colors, it is possible to easily form the anodes having different thicknesses for each pixel with high precision. The invention is applicable to an organic EL device for color display using at least four primary colors.

Second Embodiment

Figure 4:
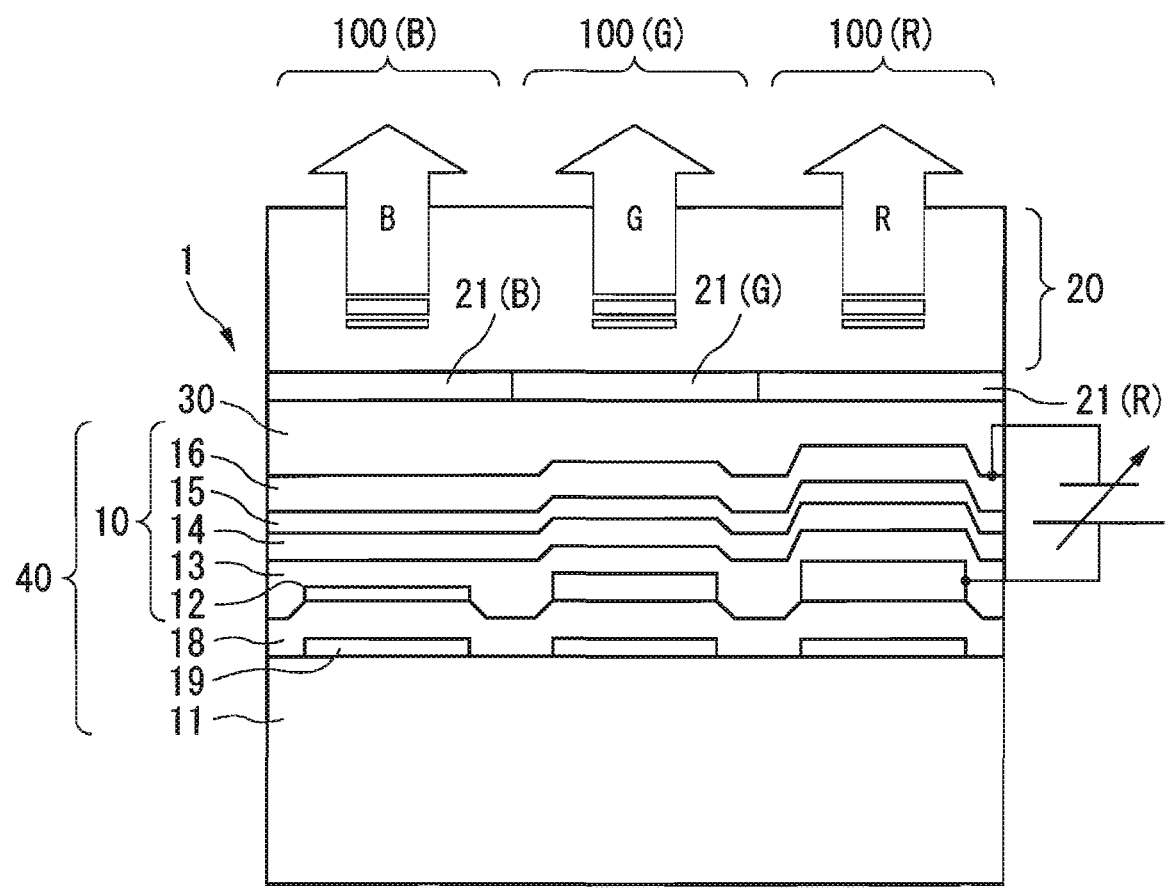
FIG. 4 is a cross-sectional view showing a configuration of an organic EL device according to a second embodiment of the invention.

FIG. 4 is a cross-sectional view schematically showing a configuration of an organic EL device (EL device) according to a second embodiment of the invention.

The organic EL device 1 shown in FIG. 4 is a top emission type device for emitting display light toward the opposite side of a substrate 11 when viewed from a light emitting layer 14. In the pixel 100(R) for emitting red (R) light, the pixel 100(G) for emitting green (G) light, the pixel 100(B) for emitting blue (B) light, an organic EL element 10 is formed. The organic EL element 10 has a transparent anode 12 formed of ITO, a hole transport layer 13, a light emitting layer 14, an electron transport layer 15, and a cathode layer 16 formed of magnesium-silver alloy and having semitransparent reflectivity, all of which are laminated on the substrate 11 formed of glass in that order.

A reflection layer 19 (total reflection layer) formed of aluminum, aluminum alloy, silver or silver alloy is formed between the substrate 11 and the anode 12. An optical resonator 40 is configured between a lower reflection layer formed of the reflection layer 19 and an upper reflection layer formed of the cathode layer 16. The hole transport layer 13 and the light emitting layer 14 used for the organic EL element 10 are formed of the same material in all of the pixels 100(R), 100(G) and 100(B). The organic EL element 10 generates white light therein.

In the present embodiment, the thickness of the anode 12 is changed for each of the pixels 100(R), 100(G) and 100(B) and the thickness of the anode 12 increases in the order of the pixel 100(B), the pixel 100(G) and the pixel (R). For example, the thickness of the anode 121 is set such that, in the pixels 100(R), 100(G) and 100(B), the thickness of the anode 12 in the pixel 100(B)=40 nm,
the thickness of the anode 12 in the pixel 100(G)=70 nm, and
the thickness of the anode 12 in the pixel 100(R)=110 nm.

That is, the thickness of the anode 12 is adjusted such that the optical lengths of the optical resonator correspond to predetermined color lights emitted from the pixels 100(R), 100(G) and 100(B), respectively.

The anode 12 is formed of the ITO film having a refractive index of 1.95.

In the present embodiment, the insulating protective layer 18 having a light transmission property is formed between the reflection layer 19 and the anode 12 to cover the front surface and the side surface of the reflection layer 19. The insulating protective layer 18 may be, for example, formed of silicon oxide having a thickness of about 30 nm and a refractive index of 1.5.

The organic EL device 1 having the above-described configuration can be manufactured by the same manufacturing method as the first embodiment. Particularly, it is preferable that the method of forming the anode 12 is equal to that of the first embodiment.

According to the present embodiment, the insulating protective layer 18 which has a light transmission property and covers the reflection layer 19 is formed between the anode 12 and the reflection layer 19. Accordingly, although several etching steps are performed so as to form the anodes 12 after forming the reflection layer 19, the reflection layer 19 does not deteriorate by the etching steps. That is, the present embodiment has the same effect as the first embodiment. According to the present embodiment, it is possible to manufacture an organic EL device including an optical resonator having high efficiency without deteriorating the reflection layer 19 when the anodes 12 having different film thickness for each pixel are formed. According to the present embodiment, since the refractive index (1.5) of the insulating protective layer 18 is smaller than the refractive index (1.8) of the insulating protective layer 18 of the first embodiment, it is possible to more thicken the film thickness of the anode 12 than that of the first embodiment and to more easily manufacture the anode 12.

In the present embodiment, a transparent substrate 20 on which a red (R) filter 21(R), a green (G) filter 21(G) and a blue filter 21(B) are formed at positions corresponding to the pixels 100(R), 100(G) and 100(B) is adhered on the cathode layer 16 by an epoxy-based transparent adhesive layer 30. Accordingly, according to the present embodiment, it is possible to emit light having higher color purity from the pixels 100(R), 100(G) and 100(B) than that of the first embodiment to widen a color reproduction range.

Other Embodiment

Although, in the above-described embodiments, the top emission type organic EL device for emitting the display light toward the opposite side of the substrate 11 is described, the invention is applicable to a bottom emission type organic EL device for emitting display light toward the substrate. That is, in the case of the bottom emission type, when a lower reflection layer having semitransparent reflectivity is formed below the anode and the insulating protective layer is formed between the anode and the lower reflection layer having the semitransparent reflectivity, it is possible to prevent the lower reflection layer from deteriorating when the anode is formed by etching.

Although, in the above-described embodiments, three layers including the hole transport layer 13, the light emitting layer 14 and the electron transport layer 15 are interposed between the anode 12 and the cathode layer 16, a plurality of layers (for example, an electron injection layer, a hold injection layer, an additional light emitting layer or the like) may be interposed between the anode 12 and the cathode layer 16. These layers may be a high molecular type or a low molecular type.

Application to Display Device

The organic EL device 1 according to the invention can be used as a passive matrix type display device or an active matrix type display device. Among these display devices; the active matrix type display device may have an electric configuration shown in FIG. 5.

Figure 5:
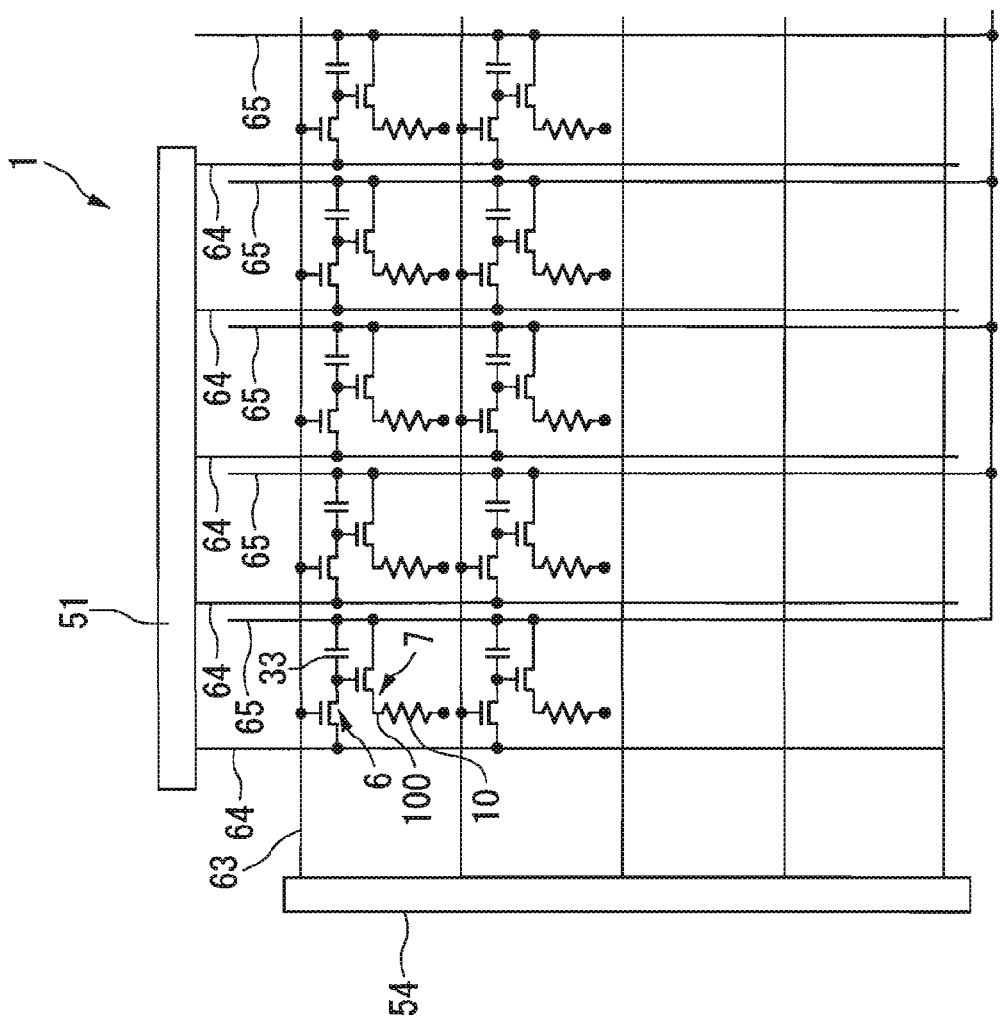
FIG. 5 is a circuit diagram showing an electric configuration of the organic EL device according to the embodiment of the invention.

FIG. 5 is a circuit diagram showing an electric configuration of the active matrix type organic EL device according to the embodiment of the invention. The organic EL device 1 shown in FIG. 5 includes a plurality of scan lines 63, a plurality of data lines 64 arranged in a direction which crosses the scan lines 63, a plurality of common feeding lines 65 parallel to the data lines 64, and pixels 100 (light emitting regions) arranged at intersections between the data lines 64 and the scan lines 63. The pixels 100 are arranged on an image display region in a matrix (array).

The data lines 64 are connected to a data line driving circuit 51 having a shift register, a level shifter, a video line, and an analog switch. The scan lines 63 are connected to a scan line driving circuit 54 having a shift register and a level shifter. Each of the pixels 100 includes a pixel switching thin film transistor 6 in which a scan signal is supplied to its gate electrode through the scan line 63, a holding capacitor 33 for holding an image signal supplied from the data line 64 through the thin film transistor 6, a current control thin film transistor 7 in which the image signal held by the holding capacitor 33 is supplied to its gate electrode, and an organic EL element 10 into which driving current flows from the common feeding line 65 when the organic EL element 10 is electrically connected to the common feeding line 65 through the thin film transistor 7. In the organic EL device 1, each of the pixels 100 corresponds to any one of red (R), green (G) and blue (B).

The technical range of the invention is not limited to the embodiments and various modifications may be made herein without departing from the scope of the invention. The concrete materials or the layer configurations of the embodiments are only exemplary and may be changed.

For example, although, in the above-described embodiments, the color display is accomplished using the three primary colors of RGB, the invention is not limited thereto and the color display may be accomplished using at least four or five primary colors. Alternatively, the color display may be accomplished using two pixels having different light colors. For example, when the color display is accomplished using four primary colors, a pixel of any one of cyan, magenta and yellow may be added to the pixels of RGB.

Although, in the above-described embodiments, the display device of the invention is configured using the organic EL device as the pixel, the invention is not limited thereto and the display device of the invention may be configured using various electro-optical devices, instead of the organic EL device. The display device of the invention is applicable to an illumination apparatus, instead of the display device such as an electro-optical device. The illumination apparatus is not the display apparatus for displaying an image or information and emits predetermined light to an irradiated body.

The display device (electroluminescence device) of the invention is applicable to manipulation panels of various electronic apparatuses, various gauges, and a monitor having a manipulation part.

Third Embodiment

Next, an organic EL device (EL device) according to a third embodiment of the invention will be described.

Figure 6:
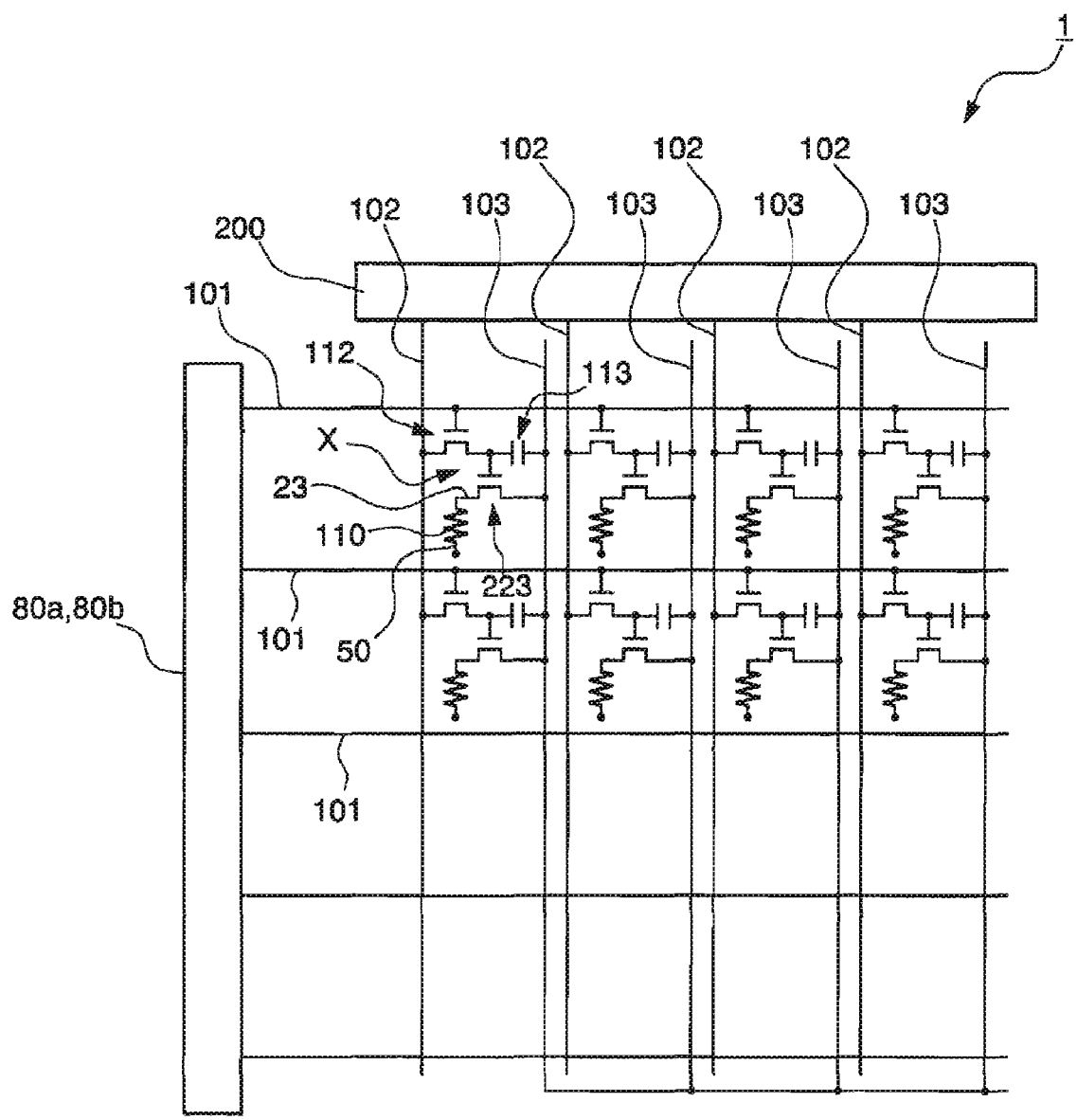
FIG. 6 is a schematic diagram showing a wiring structure of an organic EL device according to a third embodiment of the invention.

FIG. 6 is a schematic diagram showing a wiring structure of an organic EL device according to the present embodiment. In FIG. 6, reference numeral 1 denotes the organic EL device.

The organic EL device 1 is an active matrix type using a thin film transistor (hereinafter, referred to as TFT) as a switching element, and has a wiring structure including a plurality of scan lines 101 . . . , a plurality of signal lines 102 . . . extending in a direction perpendicular to the scan lines 101, and a plurality of power source lines 103 . . . extending parallel to the signal lines 102. Pixels X . . . , are formed at the peripheries of intersections between the scan lines 101 . . . and the signal lines 102 . . . .

According to the technical spirit of the invention, the active matrix using the TFT is not necessarily required and a passive matrix substrate may be used in the invention.

The signal lines 102 are connected to a data line driving circuit 200 having a shift register, a level shifter, a video line and an analog switch. The scan lines 101 is connected to scan driving circuits 80*a* and 80*b* having a shift register and a level shifter.

Each of the pixels X includes a switching TFT (switching element) 112 in which a scan signal is supplied to its gate electrode through the scan line 101, a holding capacitor 113 for holding a pixel signal supplied from the signal line 102 through the switching TFT 112, a driving TFT (switching element) 223 in which the pixel signal held by the holding capacitor 113 is supplied to its gate electrode, a pixel electrode (first electrode) 23 into which driving current flows from the power source line 103 when the pixel electrode 23 is electrically connected to the power source line 103 through the driving TFT 223, and a light emission function layer 110 interposed between the pixel electrode 23 and a cathode (second electrode) 50.

The pixel electrode 23 corresponds to the anodes of the first embodiment and the second embodiment.

Figure 7:
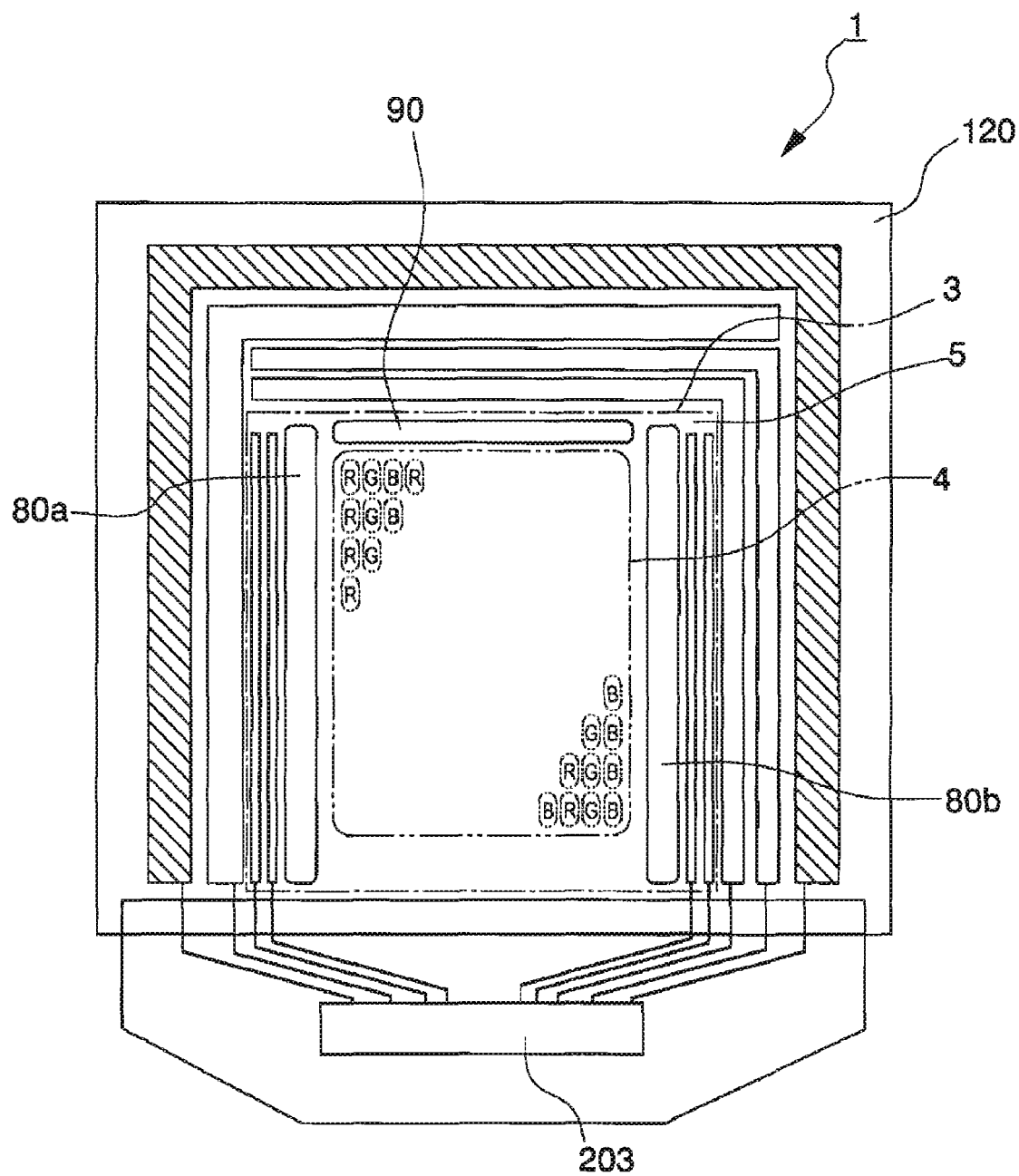
FIG. 7 is a plan view schematically showing a configuration of the organic EL device according to the third embodiment of the invention.
Figure 8:
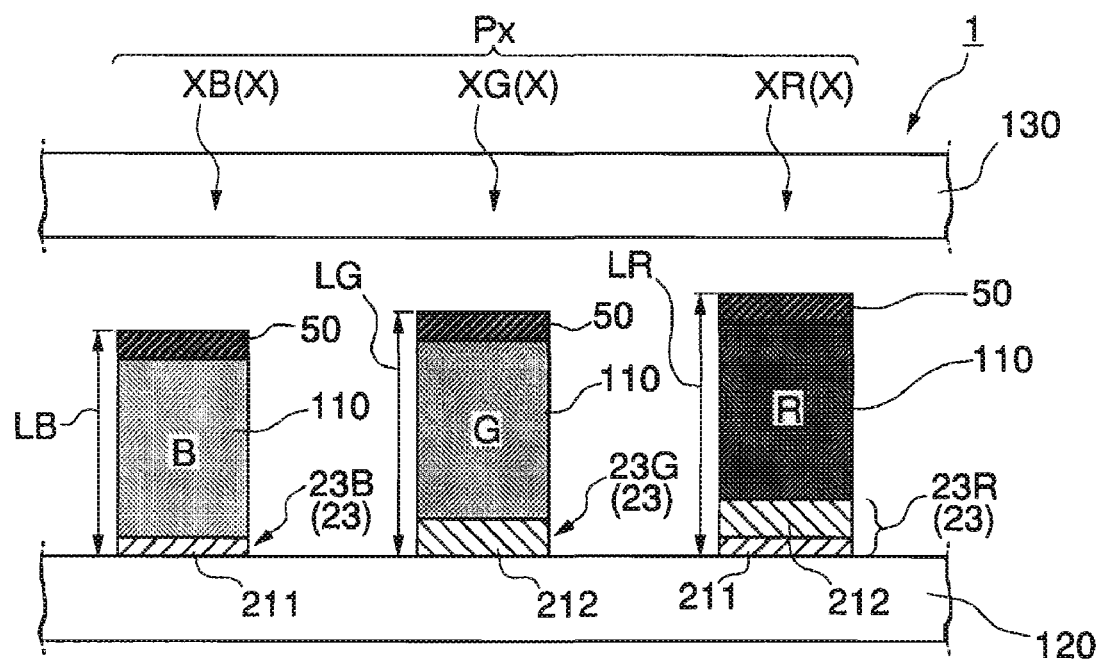
FIG. 8 is a cross-sectional view schematically showing the configuration of the organic EL device according to the third embodiment of the invention.
Figure 9:
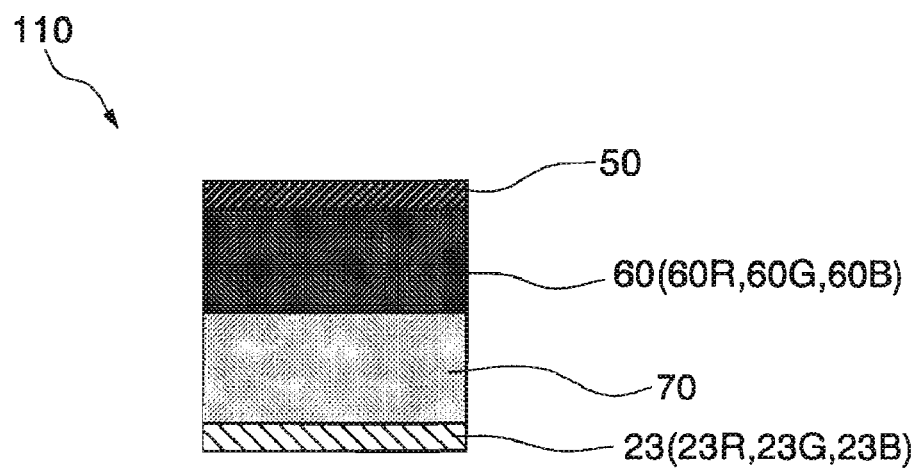
FIG. 9 is a view schematically showing a light emission function layer of the organic EL device according to the third embodiment of the invention.

Next, the concrete shape of the organic EL device 1 of the present embodiment will be described with reference to FIGS. 7 to 9. FIG. 7 is a plan view schematically showing a configuration of the organic EL device 1. FIG. 8 is a cross-sectional view schematically showing a pixel group of the organic EL device 1. FIG. 9 is a view schematically showing a light emission function layer.

First, referring to FIG. 7, the configuration of the organic EL device 1 will be described.

FIG. 7 is a view showing the organic EL device 1 for allowing the light emission function layer 110 to emit light by various wires, TFTs, pixel electrodes, various circuits formed on a substrate 120.

As shown in FIGS. 7 and 8, the organic EL device 1 includes a substrate 120 having an electrical insulating property, pixels X in which pixel electrodes 23 connected to the switching TFTs 112 are arranged on the substrate 120 in a matrix, power source lines 103 . . . arranged at the vicinities of the pixels X connected to the pixel electrodes, and a pixel part 3 (in a range denoted by a dashed line of FIG. 7) having a substantially rectangular shape when viewed in a plan view located on at least pixels X.

In the present embodiment, the pixel part 3 is divided into an actual display region 4 (in a range denoted by a dashed dot line in the figure) and a dummy region 5 (region between the dashed line and the dashed dot line) provided at the vicinity of the actual display region 4.

In the actual display region 4, a red pixel XR (first pixel), a green pixel XG (second pixel) and a blue pixel XB (third pixel), which emit red light (R), green light (G) and blue light (B), respectively, are regularly arranged in a horizontal direction of the figure. The color pixels XR, XG and XB are arranged such that the same color is arranged in a vertical direction of the figure (array shape) and has the so-called stripe arrangement. Each of the color pixels XR, XG and XB has the light emission function layer 110 for emitting lights of RGB by the operations of the TFTs 112 and 223. The color pixels XR, XG and XB are unified to configure a pixel group Px (described below) and the pixel group Px mixes the lights of RGB to display full color. Accordingly, in the actual display region 4 configured by arranging the pixel group Px in the matrix, a full-color image is displayed.

The scan line driving circuit 80*a* and 80*b* are arranged at both sides of the actual display region 4 of FIG. 7. The scan line driving circuits 80*a* and 80*b* are provided below the dummy region 5.

A test circuit 90 is provided at the upper side of the actual display region 4 of FIG. 7. The test circuit 90 is disposed below the dummy region 5. The test circuit 90 tests the operation state of the organic EL device 1, has, for example, a test information output unit (not shown) for externally outputting a test result, and tests the quality and defect of the organic EL device during manufacturing or upon shipping.

The driving voltages of the scan line driving circuits 80*a* and 80*b* and the test circuit 90 are applied from a predetermined power source part through a driving voltage conduction part (not shown) and a driving voltage conduction part (not shown). The driving control signal and the driving voltage to the scan line driving circuits 80*a* and 80*b* and the test circuit 90 are transmitted and applied from a predetermined main driver for controlling the operation of the organic EL device 1 through the driving control signal conduction part (not shown) and the driving voltage conduction part (not shown). The driving control signal is an instruction signal from the main driver related to the control when the scan line driving circuits 80*a* and 80*b* and the test circuit 90 output signals.

Next, referring to FIG. 8, the structure of the pixel group of the organic EL device 1 will be described.

In FIG. 8, the configurations of the pixel electrode 23, the light emission function layer 110 and the cathode 50 will be described in detail and the pixel electrode 23 is connected to the driving TFT 223.

As shown in FIG. 8, the pixel group Px of the organic EL device 1 has the light emission function layer 110 interposed between the pixel electrode 23 and the cathode 50 on the substrate 120. The electrodes 23 and 50 and the light emission function layer 110 are disposed between the substrate 120 and a facing substrate 130 which faces the substrate 120. A gap between the substrates 120 and 130 is a space in which inert gas such as nitrogen gas is filled and a dry state is held by a drying agent or a getter agent (not shown).

The light emission function layers 110 have different light emission materials for each of the red pixel XR, the green pixel XG and the blue pixel XB and emit color lights of RGB. The light colors are emitted through the substrate 120. Accordingly, the organic EL device 1 of the present embodiment is the bottom emission type.

The substrate 120 is a transparent substrate such as a glass substrate or a region substrate. The TFTs 112 and 223 are formed between the substrate 120 and the pixel electrode 23 and an interlayer insulating film is formed between the TFTs 112 and 223 and the pixel electrode 23.

The pixel electrode 23 includes a pixel electrode 23R formed in the red pixel XR, a pixel electrode 23G formed in the green pixel XG and a pixel electrode 23B formed in the blue pixel XB. The pixel electrodes 23R, 23G and 23B are formed of an ITO film which is a transparent conductive film. The pixel electrodes 23R, 23G and 23B are different from one another in the crystal structure or the film thickness of the ITO film.

More specifically, the pixel electrode 23R includes a crystal ITO film (first conductive film) 211 formed on the substrate 120 and an amorphous ITO film (second conductive film) 212 laminated on the crystal ITO film 211. The total film thickness of the pixel electrode 23R is 110 nm, which is the sum of the film thickness (40 nm) of the crystal ITO film 211 and the film thickness (70 nm) of the amorphous ITO film 212.

The pixel electrode 23G includes only the amorphous ITO film 212 and the film thickness thereof is 70 nm.

The pixel electrode 23B includes only the crystal ITO film 211 and the film thickness thereof is 40 nm.

The film thickness of the pixel electrode decreases in the order of the pixel electrode 23R, the pixel electrode 23G and the pixel electrode 23B.

The crystal ITO film 211 and the amorphous ITO film 212 are the conductive films formed by the sputtering method and the refractive indexes thereof are about 1.9. In the sputtering method, the ITO film can be formed in the crystal state or the amorphous state by adequately adjusting a sputter condition.

Since the pixel electrodes 23R, 23G and 23B has transparency as well as different film thicknesses, the pixel electrodes 23R, 23G and 23B can function as the optical resonator. That is, the optical length of the optical resonator can be changed (adjusted) for each of the pixel electrodes 23R, 23G and 23B.

For example, in the pixel XR for emitting the red light having a relatively long wavelength (about at least 600 nm) of visible light, by increasing (adjusting) the film thickness of the pixel electrode 23R, the optical length from the pixel electrode 23R to the cathode 50 can be adjusted to the length according to the wavelength of the red light.

For example, in the pixel XB for emitting the blue light having a relatively short wavelength (about 400 nm to 490 nm) of the visible light, by decreasing (adjusting) the film thickness of the pixel electrode 23B, the optical length from the pixel electrode 23B to the cathode 50 can be adjusted to the length according to the wavelength of the blue light.

For example, in the pixel XG for emitting the green light having a middle wavelength (about 490 nm to 570 nm) between the wavelengths of the red light and the blue light, by adjusting the film thickness of the pixel electrode 23G, the optical length from the pixel electrode 23G to the cathode 50 can be adjusted to the length according to the wavelength of the green light.

In order to lengthen the optical length, a plurality of conductive films is laminated, and, in order to shorten the optical length, a single conductive film is formed, thereby adjusting the optical length. Even in the case of forming the single conductive film, the optical length may be adjusted by selecting a thick film or a thin film in consideration of the required optical length. The optical length may be adjusted by increasing or decreasing the film thicknesses of the plurality of the conductive films in consideration of the required optical length.

Although, in the present embodiment, the film thicknesses of the pixel electrodes 23R, 23G and 23B are 110 nm, 70 nm and 40 nm, respectively, the film thickness of the pixel electrodes 23R, 23G and 23B may be 90 nm, 60 nm and 30 nm, respectively.

Next, the property of the crystal ITO film 211 and the amorphous ITO film 212 will be described.

The invention is characterized in that the crystal ITO film 211 and the amorphous ITO film 212 have different etching selectivities. In a wet etching step, the amorphous ITO film 212 is etched by oxalic acid based medicinal solution, but the crystal ITO film 211 is hardly etched by the oxalic acid based medicinal solution. Accordingly, when the crystal ITO film 211 and the amorphous ITO film 212 are simultaneously etched by the oxalic acid based medicinal solution, the amorphous ITO film 212 is selectively etched and the crystal ITO film 211 is hardly etched.

Accordingly, the amorphous ITO film 212 has the etching selectivity higher than that of the crystal ITO film 211.

When aqua regia is used as the medicinal solution, both the crystal ITO film 211 and the amorphous ITO film 212 are etched.

Although, in the present embodiment, the amorphous ITO film 212 is employed as the conductive films of the pixel electrodes 23R and 23G, indium zinc oxide (IZO) may be employed instead of the amorphous ITO film 212. Even in this case, IZO can be selectively etched by the oxalic acid based medicinal solution.

As shown in FIG. 9, the light emission function layer 110 includes a hole injection layer (light emission function layer) 70 formed on the pixel electrode 23 and an organic EL layer (light emission function layer) 60 formed on the hole injection layer 70.

As a high molecular material of the hole injection layer 70, a dispersion solution of 3,4-polyethylenedioxythiophene/polystyrenesulfonate (PEDOT/PSS), that is, a dispersion solution obtained by dispersing 3,4-polyethylenedioxythiophene in polystyrenesulfonate as a dispersion medium and dispersing this dispersion solution in water.

A material for forming the hole injection layer 70 is not limited to the above and may be various. A dispersion solution obtained by dispersing polystyrene, polypyrrole, polyaniline, polyacetylene or derivative thereof in a dispersion medium such as polystyrenesulfonate may be used. When a low molecular material is used as the material for forming the hole injection layer 70, a general hole injection material such as copper phthalocyanine, m-MTDATA, TPD or α-NPD is employed. Such a low molecular material is formed using a deposition method.

As a material for forming the organic EL layer 60, a known light emitting material for emitting phosphorescence or fluorescence is used. By providing organic EL layers 60R, 60G and 60B in the red pixel XR, the green pixel XG and the blue pixel XB, respectively, the organic EL device can perform full-color display.

As a high molecular material of the organic EL layer 60 (60R, 60G and 60B), polysilane system such as (poly)fluorene derivative (PF), (poly)paraphenylenevinylene derivative (PPV), polyphenylene derivative (PP), polyparaphenylene derivative (PPP), polyvinylcarbazol (PVK), polythiophene derivative, polymethylphenylsilane (PMPS) is adequately used. A material in which a high molecular material such as perylene-based pigment, coumalin-based pigment, or rhodamine-based pigment or a low molecular material such as rubrene, perylene, 9,10-diphenylanthracene, tetraphenylbutadiene, nile red, coumalin 6, quinacridone is doped to the above-described high molecular material may be used. As the low molecular material of the organic EL layer 60 (60R, 60G and 60B), a host material such as Alq3 or DPVBi or a material obtained by doping nile red, DCM, rubrene, perylene or rhodamine to the host material may be used. When the low molecular material is used, the organic EL layer 60 (60R, 60G and 60B) may be formed by the deposition method.

For example, MEHPPV(poly(3-methoxy6-(3-ethylhexyl)paraphenylenevinylene) is used as the material for forming the red organic EL layer 60R, for example, polydioctylflorene and F8BT (alternative copolymer of dioctylflorene and benzoadiazol) is used as a material for forming the green organic EL layer 60G, and for example, polydioctylflorene is used as a material for forming the blue organic EL layer 60B.

The thicknesses of the organic EL layers 60R, 60G and 60B are not specially limited and are preferably adjusted for each color. The film thickness is adequately adjusted by the light emission characteristics or the light emission lifetime.

The optical lengths of the lights emitted from the organic EL layers 60R, 60G and 60B are defined by distances LR, LG and LB (see FIG. 8) from the cathode 50 to the lower surfaces of the pixel electrodes 23R, 23G and 23B. In the present embodiment, the optical lengths LR, LG and LB are adjusted and defined by the film thicknesses of the pixel electrodes 23R, 23G and 23B, instead of the film thicknesses of the organic EL layers 60R, 60G and 60B. Accordingly, the film thicknesses of the organic EL layers 60R, 60G and 60B are defined in consideration of the light emission characteristics or the light emission lifetime, without depending on the optical length.

The cathode 50 is a common electrode facing the pixel electrodes 23R, 23C and 23B. The cathode 50 includes a first cathode formed of metal having a low work function and provided on the organic EL layer 60 and a second cathode provided on the first cathode to protect the first cathode. As the metal having the low work function for forming the first cathodes metal having a work function of 3.0 eV or less and more specifically Ca (work function: 2.6 eV), Sr (work function: 2.1 eV), or Ba (work function: 2.5 eV) is preferably used. The second cathode protects the first cathode from oxygen or moisture and increases the conductivity of the cathode 50. Since the organic EL device 1 according to the present embodiment is the bottom emission type device for emitting light from the substrate 120, the cathode 50 may be opaque. Accordingly, reflective metal is employed as the cathode 50 and aluminum is employed as a material of the reflective metal.

Although, in FIG. 8, the cathode 50 is formed in each organic EL layer 60, the invention is not limited thereto and the cathode 50 may have an area wider than the total area of the organic EL layer 60 to cover the organic EL layer 60.

Although, in the present embodiment, the cathode 50 is provided on the surfaces of the organic EL layers 60R, 60G and 60B, the invention is not limited thereto and electron injection layers may be provided between the organic EL layers 60R, 60G and 60B and the cathode 50 in this case, as the material of the electron injection layer, LiF or $SrF_2$ is employed. When the organic EL layers 60R, 60G and 60B are formed of a low molecular material, the cathode having a relatively high work function, such as BCP: Cs/ITO, Mg:Ag/ITO cathode or LiF/Al/ITO thin cathode.

A sealing layer may be provided on the surface of the cathode 50. As the sealing layer, a passivation layer such as a silicon oxynitride film formed on the cathode 50 is employed. Accordingly, it is possible to suppress moisture or oxygen from permeating into the light emission function layer 110.

The facing substrate 130 is a substrate having an electric insulating property. As the substrate for configuring the bottom emission type organic EL device, an opaque substrate such as a resin substrate or a metal substrate is employed. In the facing substrate 130, a concave portion may be formed at the opposite side of the substrate 120 to form a can sealing structure. A dry agent is coated on the outer circumference between the facing substrate 130 and the substrate 120. Accordingly, the facing substrate 130 functions as a sealing substrate.

In the pixel group Px having the above-described configuration, banks (partitioning walls) may be formed among the red pixel XR, the green pixel XG and the blue pixel XB.

In this case, the light emission function layer formed of a high molecular material may be formed by a droplet discharging method. The bank preferably includes an inorganic bank made of an inorganic material and an organic bank made of an organic material. Lyophilic is applied to the surface of the inorganic bank and lyophobic is applied to the surface of the organic bank. To this end, when the light emission function layer 110 is formed by the droplet discharging method, the droplet can be held between the banks.

The light emission function layer may be formed of a low molecular material. In this case, since the light emission function layer is formed using a mask deposition method, the bank need not be formed. The light emission function layer made of the low molecular material preferably includes a hole transport layer or an electron injection buffer layer.

Method of Manufacturing Organic EL Device

Next, a method of manufacturing the organic EL device according to the embodiment of the invention will be described with reference to FIGS. 10A to 10G.

Now, a step of forming pixel electrodes 23R, 23G and 23B (first electrode forming step) will be described in detail.

Figure 10A:
FIGS. 10A to 10G are views showing a method of manufacturing an organic EL device according to the embodiment of the invention.

First, as shown in FIG. 10A, a substrate 120 is prepared. Here, although not shown, TFTs 112 and 223 and an interlayer insulating film are previously formed on the surface of the substrate 120.

Figure 10B:
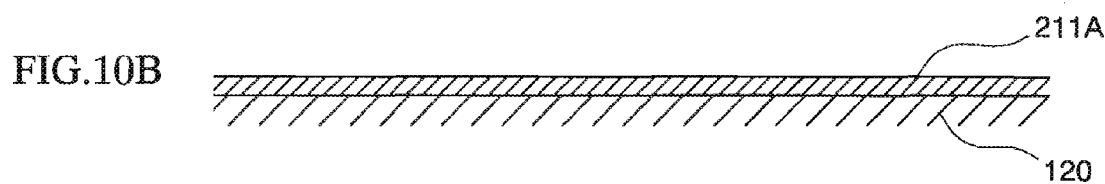

Next, as shown in FIG. 10B, a sputter film 211A formed of crystal ITO is formed on the substrate 120 by the sputtering method. The film thickness of the sputter film formed of crystal ITO is 40 nm.

Figure 10C:
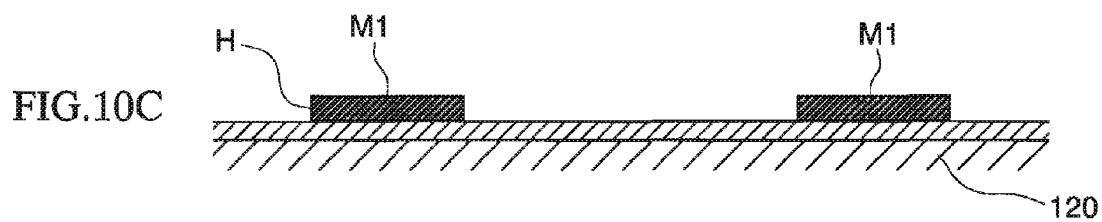

Next, as shown in FIG. 10C, a first resist mask M1 is formed on the sputter film 211A formed of crystal ITO. The first resist mask M1 is formed by applying a resist material by a spin coating method, and prebaking, exposing and developing the resist material. To this end, the sputter film 211A formed of crystal ITO is exposed from a mask opening H. The first resist mask M1 is formed on the sputter film 211A formed of crystal ITO while shielding portions in which the pixel electrodes 23R and 23B will be formed later.

Next, a wet etching process is performed to remove the exposed portion of the sputter film 211A formed of crystal ITO. Here, aqua regia is used as a medicinal solution. Thereafter, the first resist mask M1 is removed by an ashing process.

Figure 10D:

By performing the steps shown in FIGS. 10B to 10C (first patterning step), a crystal ITO film 211 is formed on the substrate 120 (FIG. 10D).

As shown in FIG. 8, the crystal ITO film 211 configures a lower conductive film of the pixel electrode 23R and a single film of the pixel electrode 23B.

Figure 10E:
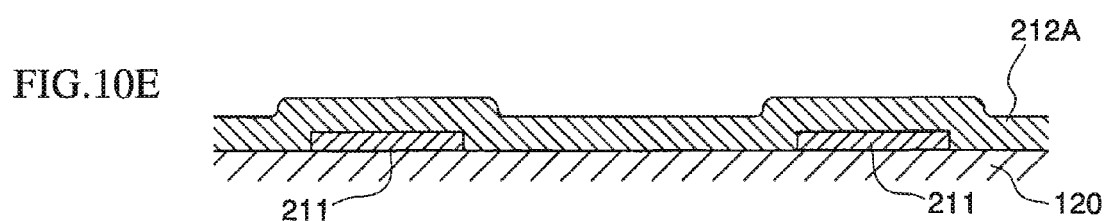

Next, as shown in FIG. 10E, a sputter film 212A formed of amorphous ITO is formed on the substrate 120 by the sputtering method. The sputter film 212A formed of amorphous ITO is laminated on the crystal ITO film 211 formed on the substrate 120. Here, the film thickness of the sputter film 212A formed of amorphous ITO is 70 nm.

Figure 10F:
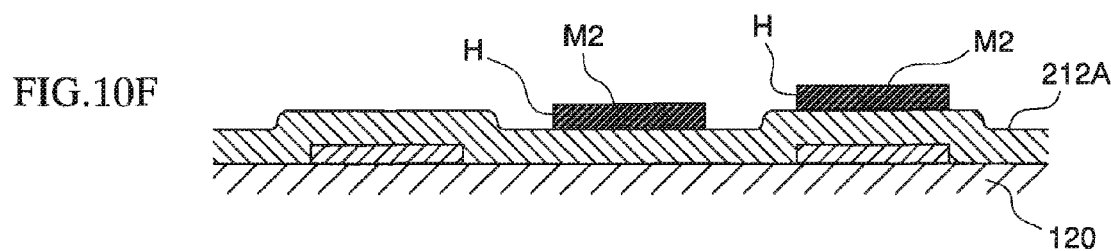

Next, as shown in FIG. 10F, a second resist mask M2 is formed on the sputter film 212A formed of amorphous ITO. The second resist mask M2 is formed by the same method as the first resist mask M1. To this end, the sputter film 212A formed of amorphous ITO is exposed from a mask opening H. The second resist mask M2 is formed on the sputter film 212A formed of amorphous ITO while shielding portions in which the pixel electrodes 23R and 23G will be formed later.

Next, a wet etching process is performed to remove the exposed portion of the sputter film 212A formed of amorphous ITO. Here, an oxalic acid based medicinal solution is used as a medicinal solution.

Since the sputter film 212A formed of amorphous ITO has etching selectivity higher than that of the crystal ITO film 211, the sputter film 212A formed of amorphous ITO is etched. Since the crystal ITO film 211 is not etched, the crystal ITO film 211 remains on the substrate 120. Thereafter, the second resist mask M2 is removed by the ashing process.

Figure 10G:
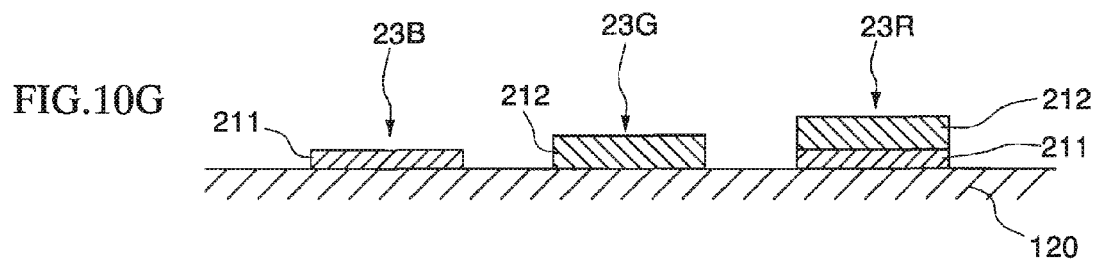

By performing the steps shown in FIGS. 10E to 10F (second patterning step), an amorphous ITO film 212 is formed on the substrate 120 and the crystal ITO film 211 (FIG. 10G).

By performing the above-described steps, the pixel electrode 23B formed of the crystal ITO film 211 and having the film thickness of 40 nm, the pixel electrode 23G formed of the amorphous ITO film 212 and having the film thickness of 70 nm, and the pixel electrode 23R formed of a lamination of the crystal ITO film 211 and the amorphous ITO film 212 and having the film thickness of 110 nm are formed.

As described above, in the organic EL device 1 according to the embodiment, each of the plurality of pixel electrodes 23R, 23G and 23B in the pixel group Px is formed of any one of the crystal ITO film 211 and the amorphous ITO film 212 having different etching selectivities or a lamination structure of the crystal ITO film 211 and the amorphous ITO film 212 having different etching selectivities. The pixel electrode 23R has a lamination structure of the crystal ITO film 211 and the amorphous ITO film 212. The pixel electrode 23G has a single layer structure of the amorphous ITO film 212. The pixel electrode 23B has a single layer structure of the crystal ITO film 211. Since the pixel electrodes 23R, 23G and 23B are formed using the etching selectivity of the conductive film, the number of the steps of forming the resist mask is more reduced compared the existing method. In other words, since the number of the exposing processes or the number of the mask is reduced, it is possible to realize an organic EL device with low manufacturing cost.

As described above, since the optical length is adjusted by changing the film thicknesses of the pixel electrodes 23R, 23G and 23B, it is possible to realize an organic EL device having high display performance. More specifically, improvement of a NTSC ratio, optimization of white balance, and achromatic image of white display can be realized and thus freedom of color design can be improved.

Fourth Embodiment

Next, an organic EL device according to a fourth embodiment of the invention will be described.

The present embodiment is similar to the embodiment shown in FIG. 8 except the materials of the conductive films for configuring the pixel electrodes 23R, 23G and 23B.

In the present embodiment, as a first conductive film, $SnO_2$ (tin oxide) is employed instead of the crystal ITO film 211, and, as a second conductive film, ZnO (zinc oxide) is employed instead of the amorphous ITO film 212.

The $SnO_2$ and ZnO are different from each other in the etching selectivity. In a wet etching step, ZnO is etched by an oxalic acid based medicinal solution, but $SnO_2$ is hardly etched by the oxalic acid based medicinal solution. Accordingly, when $SnO_2$ and ZnO are simultaneously etched by the oxalic acid based medicinal solution, ZnO is selectively etched and $SnO_2$ is hardly etched. Accordingly, ZnO has the etching selectivity higher than that of $SnO_2$. When aqua regia is used as the medicinal solution, both $SnO_2$ and ZnO are etched.

When the pixel electrode 23 is formed of the above-described materials, the pixel electrode 23R has a lamination structure of $SnO_2$ and ZnO, which are sequentially laminated on a substrate 120. The pixel electrode 23G has a single layer structure of ZnO which is formed on the substrate 120. The pixel electrode 23B has a single layer structure of $SnO_2$ which is formed on the substrate 120.

The film thickness of $SnO_2$ may be equal to that of the crystal ITO 211 and the film thickness of ZnO may be equal to that of the amorphous ITO film 212.

A method of forming the pixel electrodes 23R, 23G and 23B formed of the above-described conductive films is performed by the steps shown in FIGS. 10A to 10G except that the a $SnO_2$ film is employed instead of the sputter film 211A formed of the crystal TO and a ZnO film is employed instead of the sputter film 212A formed of amorphous ITO.

More specifically, as the conductive films of the pixel electrodes 23R and 23B, $SnO_2$ is formed by a step of forming the $SnO_2$ film, a step of forming a first resist mask M1, and a step of performing a wet etching process using aqua regia.

Thereafter, as the conductive films of the pixel electrodes 23R and 23G, ZnO is formed by a step of forming the ZnO film, a step of forming a second resist mask M2, and a step of performing a wet etching process using oxalic acid.

Accordingly, even when the materials of the conductive materials are changed, the same effect as the third embodiment is obtained.

Fifth Embodiment

Next, an organic EL device according to a fifth embodiment of the invention will be described.

In the present embodiment, the same configurations as the above-described embodiment are denoted by same reference numerals and thus their description will be omitted.

Figure 11:
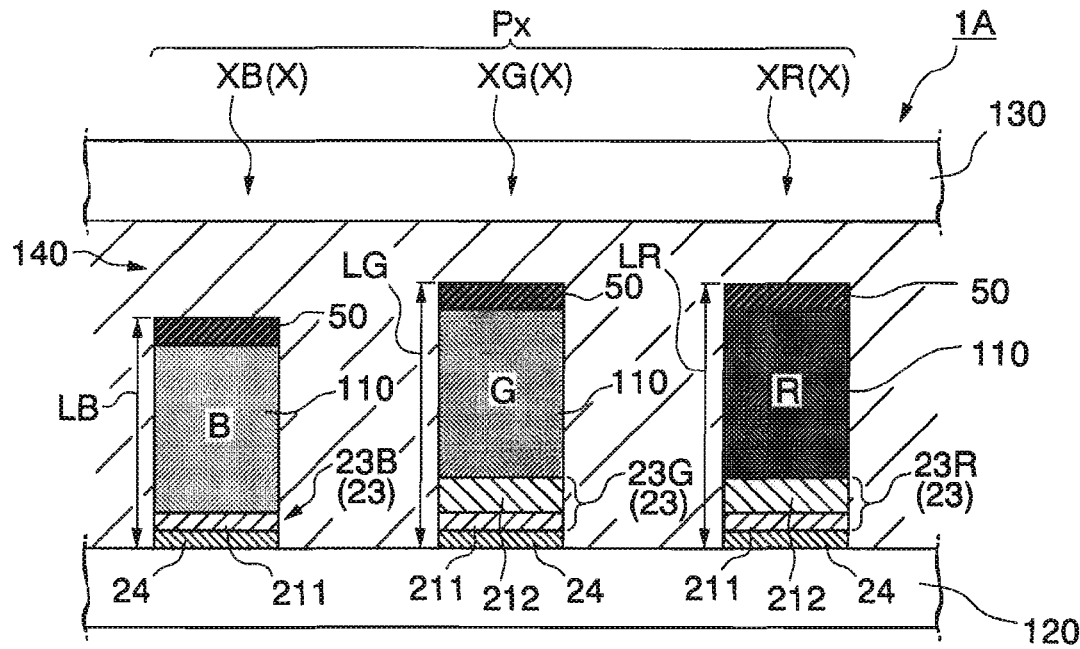
FIG. 11 is a cross-sectional view schematically showing a configuration of an organic EL device according to a fifth embodiment of the invention.

FIG. 11 is a cross-sectional view schematically snowing a pixel group Px of an organic EL device 1A according to the present embodiment.

The organic EL device 1A according to the present embodiment is different from the above-described embodiment in that a top emission structure for emitting light from a facing substrate 130 is employed.

In order to realize the top emission structure, the organic EL device 1A includes a reflection film 24 formed between a pixel electrode 23 and a substrate 120, a cathode 50 having transparency, and the facing substrate 130 formed of a transparent substrate.

The reflection film 24 is provided on the substrate 120 at color pixels XR, XG and XB. The material of the reflection film 24 may be metal having conductivity or light reflectivity such as Al, and the reflection film 24 is connected to the pixel electrodes 23R, 23G and 23B. The reflection film 24 is also connected to the drain electrode of the above-described driving TFT 223.

The reflection film 24 is patterned by the step prior to the step shown in FIG. 10B. A sputter film 211A formed of crystal ITO is formed to cover the patterned reflection film 24 and the whole surface of the substrate 120 and a patterned crystal ITO film 211 is formed by the steps shown in FIGS. 10C and 10D.

The cathode 50 includes a first cathode and a second cathode similar to the above, but, in order to ensure transparency, the material for forming the second cathode is different from that of the above. As the second cathode, a material having high conductivity, chemical stability, transparency and a relatively low film-forming temperature is used.

For example, ITO or IZO may be employed. In addition, indium tungsten oxide or indium gallium oxide may be employed.

The facing substrate 130 has a light transmission property and an electrical insulating property. For example, the facing substrate 130 may be a glass substrate or a transparent resin substrate. The facing substrate 130 functions as a protective substrate for protecting a sealing region between the substrate 120 and the facing substrate 130 or the above-described light emission function layer 110. The material of the substrate 120 may be an opaque material.

A sealing region 140 is formed between the substrate 120 and the facing substrate 130. In the top emission structure, seal resin formed of acrylic or epoxy resin is filled in the sealing region 140. A gas barrier layer for improving a gas barrier property may be provided between the sealing resin and the cathode 50. Alternatively, a buffer layer for suppressing crack of the gas barrier layer or the cathode 50 may be provided.

In the present embodiment, the pixel electrodes 23G and 23R have a lamination structure of the crystal ITO film 211 and the amorphous ITO film 212 and the pixel electrode 23B has a single layer structure of the crystal ITO film 211. Accordingly, in the present embodiment, the pixel electrodes 23R and 23G have the same film thickness and the film thickness of the pixel electrode 23B is smaller than those of the pixel electrodes 23R and 23G. In order to form the pixel electrodes 23R, 23G and 23B, the crystal ITO film 211 may be formed in the respective pixel electrodes 23R, 23G and 23B. In this case, in FIG. 10C, a resist mask for covering the sputter film 211A formed of crystal ITO is used in portions in which the pixel electrodes 23R, 23G and 23B will be formed. Accordingly, in the present embodiment, by causing the opening shape of the resist mask to be different from that of the first resist mask M1 according to the third embodiment, it is possible to form the pixel electrodes 23R, 23G and 23B according to the present embodiment. To this end, the optical lengths of the pixels XR, XG and XB are adjusted.

As described above, in the organic EL device 1A according to the present embodiment, the reflection film 24 can reflect the light emitted from the light emission function layer 110 and emit the light to the cathode 50. The light emitted from the light emission function layer 110 includes light (non-reflective light) output from the cathode 50 without being reflected from the reflection film 24 and light (reflective light) output from the cathode 50 after being reflected from the reflection film 24. When the light is reflected from the reflection film 24, the optical length more lengthens by the passage of the conductive films of the pixel electrodes 23R, 23G and 23B, compared with the non-reflective light and thus the optical length need be adjusted by the balance between the reflective light and the non-reflective light. As described in the above-described embodiment, since the optical lengths LR, LG and LB are adjusted by the single layer structure of any one of the crystal ITO film 211 and the amorphous ITO film 212 or the lamination structure thereof, the optical lengths can be easily adjusted even when the reflective light and the non-reflective light are mixed.

Sixth Embodiment

Next, an organic EL device according to a sixth embodiment of the invention will be described.

Figure 12:
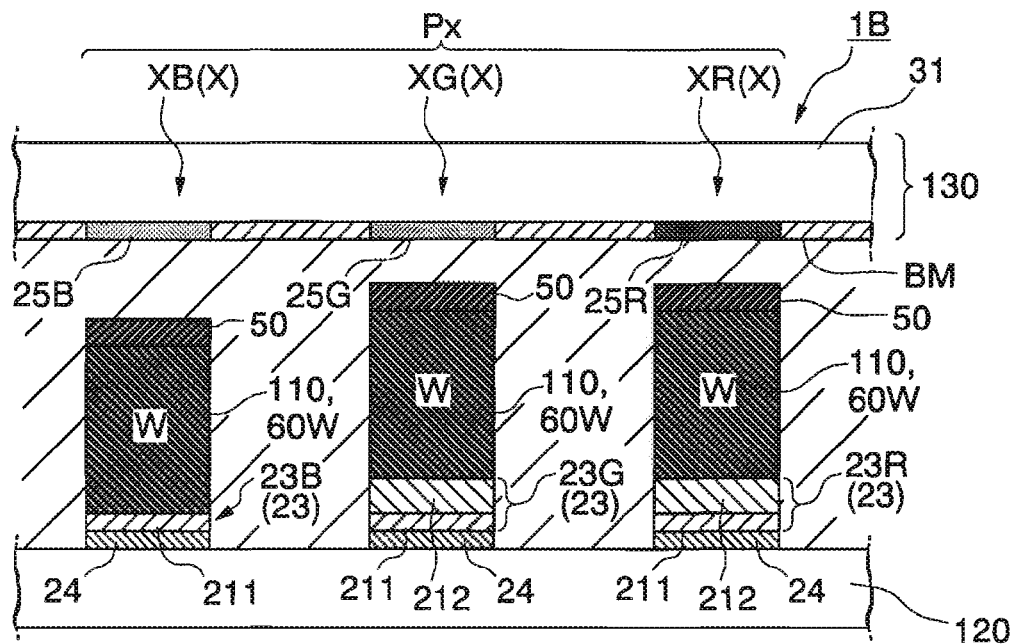
FIG. 12 is a cross-sectional view schematically showing a configuration of an organic EL device according to a sixth embodiment of the invention.

In the present embodiment, the same configurations as the above-described embodiment are denoted by the same reference numerals and thus their description will be omitted. FIG. 12 is a cross-sectional view schematically showing a pixel group of the organic EL device 1B according to the present embodiment.

The organic EL device 1B according to the present embodiment is a top emission structure, but is different from the above-described embodiment in that a facing substrate 130 functions as a color filter substrate and a light emission function layer 110 has a white organic EL layer.

The facing substrate 130 according to the present embodiment has a color filter substrate 31 as a base body, color layers 25R, 25G and 25B and a light shielding layer BM formed on the surface of the color filter substrate 31 which faces a substrate 120.

The color layers 25R, 25G and 25B correspond to pixels XR, XG and XB for configuring a pixel group Px and face light emission function layers 110. The light shielding layer BM is formed among the color layers 25R, 25G and 253. The material of the light shielding layer BM is light shielding metal such as Cr or resin black. To this end, the facing substrate 130 outputs the light emitted from the light emission function layers 110 through the color 25R, 25G and 25B. The color layers 25R, 25G and 25B transmit the emitted light with different light transmission properties.

The light emission function layer 110 has a white organic EL layer 60W for emitting white light. The white light is obtained by synthesizing chromatic wavelengths of a plurality of peak wavelengths.

In the organic EL device having the above-described configuration, since the color layers 25K, 25G and 25B are provided on an optical path of the light emitted from the white organic EL layer 60W, the white light is colored by the color layers 25R, 25G and 25B. That is, red light is output from the pixel XR through the color layer 25R, green light is output from the pixel XG through the color layer 25G, and blue light is output from the pixel XB through the color layer 25B. By synthesizing the colored lights, the display light of the pixel group Px is obtained.

As described above, in the present embodiment, since the white lights output from the light emission function layers 110 transmit the color layers 25R, 25G and 25B and thus the color layers 25R, 25G and 25B color the white light to RGB (transmit RGB for each chromatic wavelength), it is possible to output different colors through the pixels XR, XG and XB.

Since the white organic EL layer 60W formed of a monochromatic light emitting material is employed as the organic EL layers for configuring the light emission function layers 110, organic EL layers having different colors need not be coated in the pixels XR, XG and XB, respectively. Accordingly, unlike the case where a plurality of light emitting materials is formed, since only one material (white material) may be formed, it is possible to simplify the step of forming the organic EL layer 60W and to realize an organic EL device with low cost.

Although, in the present embodiment, the color layers 25R, 25G and 25B are provided on the facing substrate 130, the color layers 25R, 25G and 25B may be formed on the rear surface (surface on which the pixel electrodes are not formed) of the substrate 120.

Modified Example of Sixth Embodiment

Next, a modified example of the sixth embodiment will be described.

In the modified example, instead of the white organic EL layer 60W, color organic EL layers 60R, 60G and 60B shown in the fifth embodiment are employed. The organic EL layers 60R, 60G and 60B face the color layers 25R, 25G and 25B, respectively. In the modified example, since the lights of RGB output from the color organic EL layers 60R, 60G and 60B transmit the color layers 25R, 25G and 25B, respectively, the color purity of the lights emitted from the color layers 25R, 25G and 25B can increase.

In the first to sixth embodiments, the display lights of ROB are output from the pixels XR, XG and XB using the plurality of organic EL 60R, 60G and 60B, the white organic EL layer 60W or the plurality of color layers 25.

The invention is not limited thereto and the pixel group Px may have four color pixels. For example, in addition to the primary color pixels XR, XG and XB, a complementary color pixel XC such as cyan (C) may be included. In this case, the film thickness of a pixel electrode 23 in the pixel XC may be different from those of the pixel electrodes 23R, 23G and 23B or equal to any one of the pixel electrodes 23R, 23G and 23B.

When the film thickness of the pixel electrode 23C is different from those of the pixel electrodes 23R, 23G and 23B, that is, when the pixel electrodes 23R, 23G, 23K and 23C having different film thicknesses are formed, three kinds of conductive films having different etching properties need be employed. Using three kinds of conductive films, it is possible to form the pixel electrodes 23R, 23G, 23B and 23C by a single-layer film, a two-layer lamination film or a three-layer lamination film. To this end, by causing the film thicknesses of the pixel electrodes 23R, 23G, 23B and 23C to be different from one another, it is possible to adjust the optical lengths of the pixels XR, XG, XB and XC.

When the film thickness of the pixel electrode 23C is equal to that of any one of the pixel electrodes 23R, 23G and 23B, the configuration of the pixel electrode 23C is preferably equal to that of the pixel electrode 23G or the pixel electrode 23B. This is because the chromatic wavelength of cyan is intermediate between those of B and G and thus the optical length is hardly influenced although the pixel electrode 23C has the same configuration as the pixel electrode 23G or the pixel electrode 23B.

When the film thickness of the pixel electrode 23C is equal to that of any one of the pixel electrode 23G and the pixel electrode 23B, the four pixels XR, XG, XB and XC of which the optical lengths are adjusted can be realized by two kinds of conductive films. In order to form the pixel electrodes 23R, 23G, 23B and 23C, the steps of the above-state described embodiment can be changed only by changing the resist mask shown in FIG. 10C and thus the number of the steps can be prevented from increasing.

In addition to the pixel XC, a configuration for employing magenta (M) or yellow (Y) or a configuration in which the pixel group Px has five color pixels may be employed.

In addition, two color pixels may be employed.

Example of Installation into Electronic Apparatus

Next, electronic apparatuses of the invention will be described.

The light emitting device (EL) device of the embodiment of the invention can be used as a display device in a variety of electronic apparatuses such as a mobile phone, a personal computer or a PDA. The light emitting device of the embodiment of the invention may be used as an exposure head in an image forming apparatus such as a digital copier or a printer.

The electronic apparatus has the above-described organic EL device (organic EL device) 1 as a display part and are shown in FIG. 13.

Figure 13A:
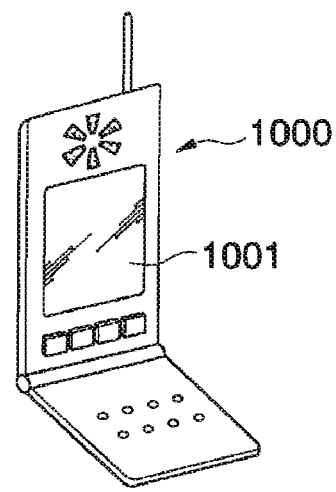
FIG. 13 is a view showing an electronic apparatus having the organic EL device according to the embodiment of the invention.

FIG. 13A is a perspective view showing an example of a mobile phone. In FIG. 13A, a mobile phone 1000 has a display part 1001 using the above-described organic EL device 1.

Figure 13B:
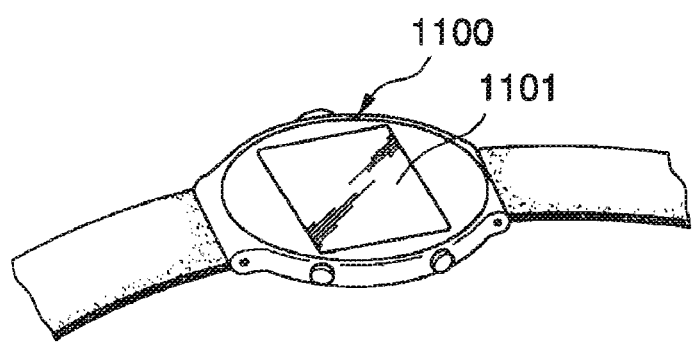

FIG. 13B is a perspective view showing an example of a wristwatch type electronic apparatus. In FIG. 13B, a wristwatch 110 has a display part 1101 using the above-described organic EL device 1.

Figure 13C:
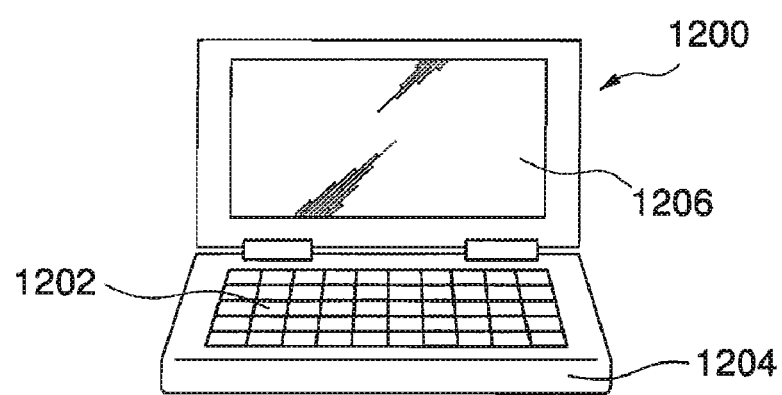

FIG. 13C is a perspective view showing a portable information processing apparatus such as a word processor or a personal computer. In FIG. 13C, an information processing apparatus 1200 has an input part 1201 such as a keyboard, a display part 1202 using the above-described organic EL device 1 and an information processing apparatus main body (case) 1203.

Since the electronic apparatuses shown in FIGS. 13A to 13C have the display parts 1001, 1101 and 1202 having the above-described organic EL device (organic EL device) 1, respectively, it is possible to realize low cost and high display performance of the organic EL device for configuring the display part.

What is claimed is:

1. An electroluminescence device, comprising:
   a plurality of pixels formed on a substrate, each pixel including a first electrode, a second electrode, and a light emitting layer arranged between the first and second electrodes;
   the plurality of pixels including first, second, and third pixels, the third pixel being different from the first and second pixels;
   the first electrode in the first pixel being formed of a first conductive film and a second conductive film, the second conductive film being laminated on the first conductive film;
   the first electrode in the third pixel being formed of the second conductive film;
   the first electrode in the second pixel being formed of the first conductive film;
   the first conductive film being a crystal conductive film; and
   the second conductive film being an amorphous conductive film.

2. The electroluminescence device according to claim 1, wherein
   the first and second conductive films being transparent conductive materials identical to each other.

3. The electroluminescence device according to claim 1, wherein a reflection film is formed between the substrate and the first electrode.

4. The electroluminescence device according to claim 1, wherein a color emitted from the first pixel, a color emitted from the second pixel and a color emitted from the third pixel are different from one another.

5. The electroluminescence device according to claim 1, wherein a wavelength of light emitted from the light emitting layer in the first pixel, a wavelength of light emitted from the light emitting layer in the second pixel, and a wavelength of light emitted from the light emitting layer in the third pixel are different from one another.

6. The electroluminescence device according to claim 1, wherein each of the plurality of pixels includes a color layer which faces the light emitting layer and the color of the color layer in the first pixel, the color of the color layer in the second pixel and the color of the color layer in the third pixel are different from one another.

* * * * *